(12) United States Patent
Klugkist et al.

(10) Patent No.: US 10,976,196 B2
(45) Date of Patent: Apr. 13, 2021

(54) SENSOR MARK AND A METHOD OF MANUFACTURING A SENSOR MARK

(71) Applicant: ASML NETHERLANDS B.V., Veldhoven (NL)

(72) Inventors: Joost André Klugkist, Waalre (NL); Vadim Yevgenyevich Banine, Deurne (NL); Johan Franciscus Maria Beckers, Veldhoven (NL); Madhusudhanan Jambunathan, Eindhoven (NL); Maxim Aleksandrovich Nasalevich, Eindhoven (NL); Andrey Nikipelov, Eindhoven (NL); Roland Johannes Wilhelmus Stas, 's-Hertogenbosch (NL); David Ferdinand Vles, Eindhoven (NL); Wilhelmus Jacobus Johannes Welters, Weert (NL); Sandro Wricke, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 67 days.

(21) Appl. No.: 16/488,259

(22) PCT Filed: Feb. 15, 2018

(86) PCT No.: PCT/EP2018/053761
§ 371 (c)(1),
(2) Date: Aug. 23, 2019

(87) PCT Pub. No.: WO2018/166738
PCT Pub. Date: Sep. 20, 2018

(65) Prior Publication Data
US 2020/0064183 A1   Feb. 27, 2020

(30) Foreign Application Priority Data

Mar. 15, 2017  (EP) .................................... 17161058
Jun. 19, 2017  (EP) .................................... 17176554
Jul. 26, 2017  (EP) .................................... 17183234

(51) Int. Cl.
*G01J 1/42*   (2006.01)
*G03F 7/20*   (2006.01)

(52) U.S. Cl.
CPC ............ G01J 1/429 (2013.01); G03F 7/7085 (2013.01)

(58) Field of Classification Search
CPC .............................. G01J 1/429; G03F 7/7085
See application file for complete search history.

(56) References Cited

U.S. PATENT DOCUMENTS 5,229,872 A   7/1993  Mumola
5,296,891 A   3/1994  Vogt et al.
(Continued)

FOREIGN PATENT DOCUMENTS

CN   101109908   1/2008
CN   101535899   9/2009
(Continued)

OTHER PUBLICATIONS

Japanese Office Action issued in corresponding Japanese Patent Application No. 2019-550645, dated Sep. 29, 2020.
(Continued)

*Primary Examiner* — Anne M Hines
(74) *Attorney, Agent, or Firm* — Pillsbury Winthrop Shaw Pittman LLP

(57) ABSTRACT

A sensor mark including: a substrate having: a deep ultra violet (DUV) radiation absorbing layer including a first material which substantially absorbs DUV radiation; and a protecting layer including a second material, wherein: the
(Continued)

DUV radiation absorbing layer has a through hole in it; the protecting layer is positioned, in plan, in the through hole and the protecting layer in the through hole has a patterned region having a plurality of through holes; and the second material is more noble than the first material.

20 Claims, 12 Drawing Sheets

(56) References Cited

U.S. PATENT DOCUMENTS

| | | | |
|---|---|---|---|
| 5,523,193 | A | 6/1996 | Nelson |
| 2004/0207824 | A1 | 10/2004 | Lof et al. |
| 2005/0041225 | A1 | 2/2005 | Sengers et al. |
| 2007/0115452 | A1* | 5/2007 | Moest .................. G03F 9/7003 355/77 |
| 2007/0243397 | A1 | 10/2007 | Ludwig et al. |
| 2008/0013059 | A1 | 1/2008 | Kok et al. |
| 2008/0164415 | A1 | 7/2008 | Kierse et al. |
| 2010/0321695 | A1 | 12/2010 | Van Buel et al. |
| 2011/0013188 | A1* | 1/2011 | Slotboom ............ G01B 11/272 356/401 |

FOREIGN PATENT DOCUMENTS

| | | |
|---|---|---|
| CN | 101957561 | 1/2011 |
| EP | 1420298 | 5/2004 |
| EP | 1500982 | 1/2005 |
| EP | 2264528 | 12/2010 |
| JP | 2002006478 | 1/2002 |
| JP | 2005045265 | 2/2005 |
| JP | 2007180501 | 7/2007 |
| JP | 2011003898 | 1/2011 |
| JP | 2013074177 | 4/2013 |

OTHER PUBLICATIONS

International Search Report and Written Opinion issued in corresponding PCT Patent Application No. PCT/EP2018/053761, dated Jun. 11, 2018.

Chinese Office Action issued in corresponding Chinese Patent Application No. 2018800179978, dated Dec. 28, 2020.

* cited by examiner

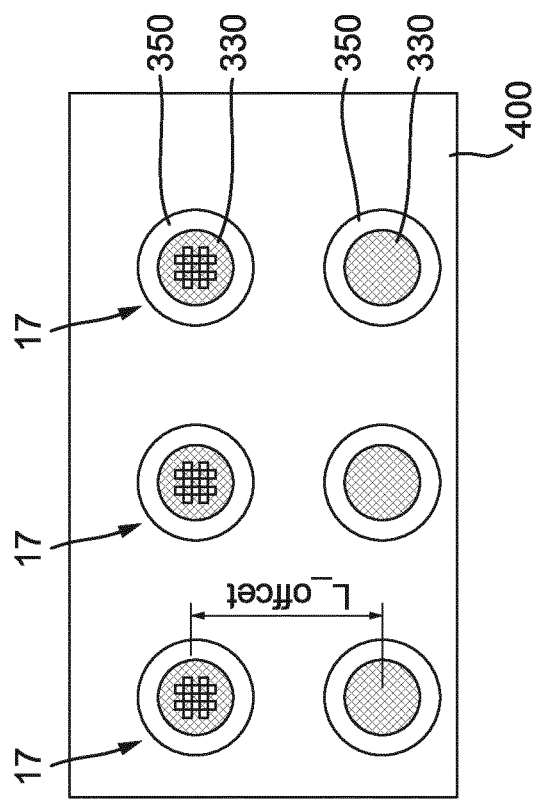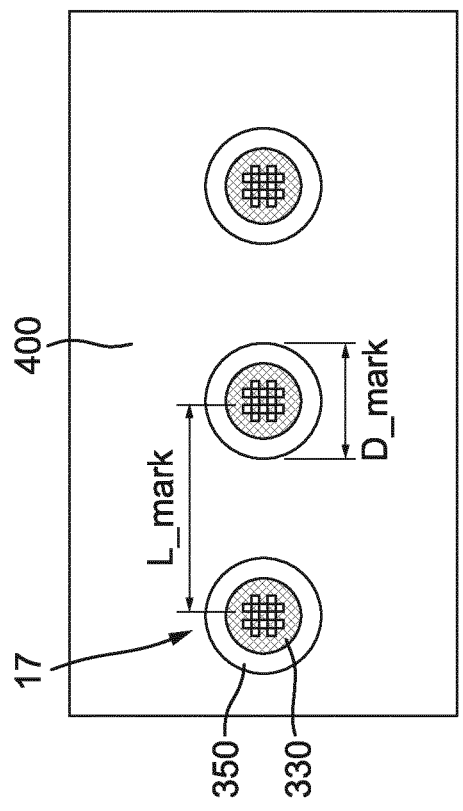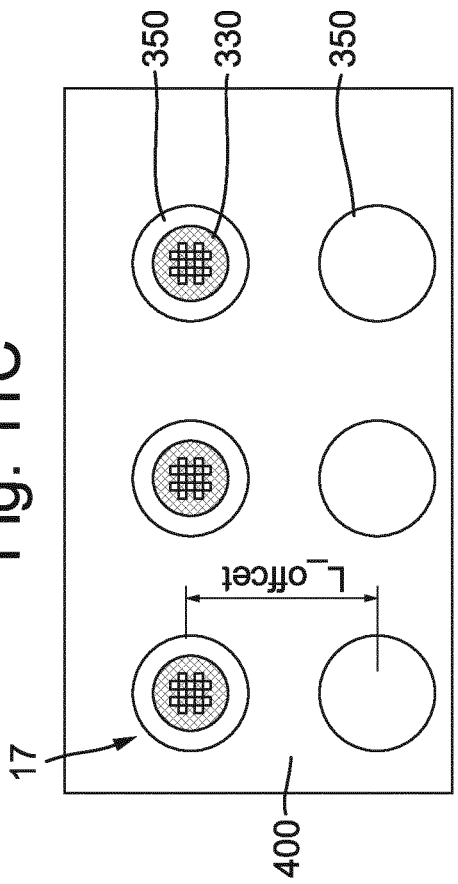

Fig. 15A
Fig. 15B
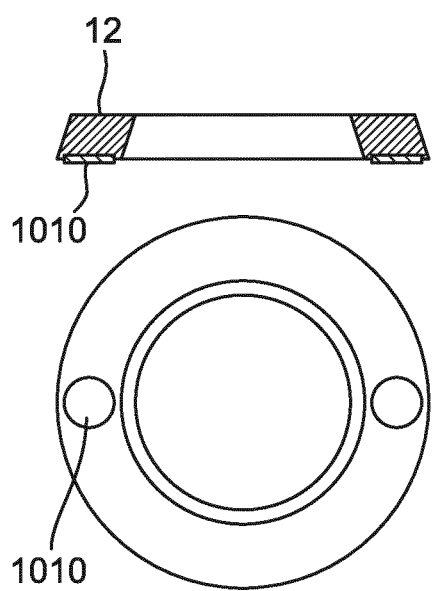
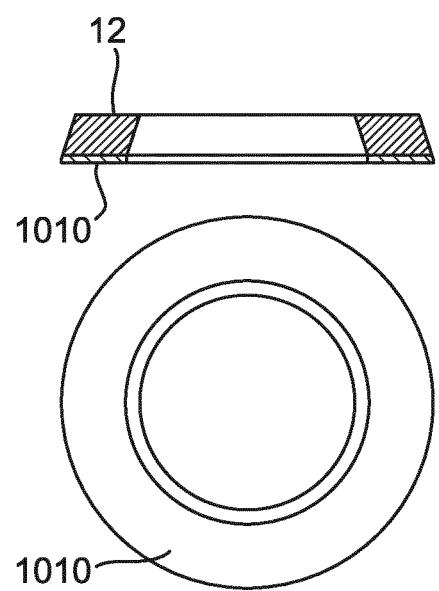

SENSOR MARK AND A METHOD OF MANUFACTURING A SENSOR MARK

CROSS-REFERENCE TO RELATED APPLICATIONS

This application is the U.S. national phase entry of PCT Patent Application No. PCT/EP2018/053761, filed on Feb. 15, 2018, which claims the benefit of priority claims priority of European patent application no. 17161058.7 which was filed on Mar. 15, 2017, and of European patent application no. 17176554.8 which was filed on Jun. 19, 2017, and of European patent application no. 17183234.8 which was filed on Jul. 26, 2017 and each of which is incorporated herein in its entirety by reference.

FIELD

The present invention relates to a sensor mark for a sensor for a lithography apparatus and to a method of manufacturing a sensor mark.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

In an immersion lithography apparatus, a liquid is confined to an immersion space by a fluid handling structure (or a liquid confinement structure). The immersion space is between a final optical element of a projection system through which the pattern is imaged and the substrate onto which the pattern is transferred or a support table on which the substrate is supported. The liquid may be confined to the immersion space by a fluid seal. The fluid handling structure may create or use a flow of gas, for example to help in controlling the flow and/or the position of the liquid in the immersion space. The flow of gas may help form the seal to confine the liquid to the immersion space. At least part of sensors that are integrated into the support table (e.g. sensor marks) come into contact with immersion liquid.

Immersion lithograph apparatus rely on several sensors integrated into the support table which supports the substrate. These sensors are used for:

substrate/support table alignment with respect to a reference frame;

lens (re)adjustment, setup, heating compensation; and reticle (mask) heating compensation.

Sensor marks are integrated into a stack of thin film layers which is deposited on a quartz plate integrated into the support table and act as:

spatial transmission filters for DUV (Integrated Lens Interferometry At Scanner "ILIAS" sensor, Parallel ILIAS sensor (PARIS), Transmission Image Sensor "TIS" sensor functionality); transmission filter can be realized as a patterned absorbing layer stack, where absorber is a dense metal (chromium) or other material.

spatial reflective filters for Visible Radiation "VIS", Near Infra Red "NIR", Medium Infra Red "MIR" (Smart Alignment Sensor Hybrid "SMASH" sensor functionality).

The reflection from the top surface of the stack (mark-free region) can be used for the level sensor.

In order to protect a metal (chromium) layer of a sensor mark from galvanic corrosion, a voltage is applied between the fluid handling structure and the sensor mark. This can be seen as a galvanic protection. In the absence of such a voltage, a cell is formed between the stainless steel of the fluid handling structure and the chromium of the layer of the sensor mark, with the immersion liquid acting as the electrolyte.

The presence of the galvanic protection can lead to other layers of the sensor mark which are less noble than chromium corroding at an accelerated rate.

Additionally a photo current can be induced due to interaction of layers with the DUV radiation. The photo current is generated by the photo electric effect. The presence of a photo current can accelerate corrosion.

Corrosion of materials in layers of the sensor marks is undesirable as this degrades the sensor marks and thereby the ability of the sensors to make measurements and also introduces particles into the immersion liquid which can result in imaging errors.

SUMMARY

It is desirable, to provide a sensor mark with improved resistance to corrosion.

According to an aspect, there is provided a sensor mark comprising: a substrate having: a first deep ultra violet (DUV) absorbing layer comprising a first material which substantially absorbs DUV radiation; a first protecting layer comprising a second material; and wherein: the first DUV absorbing layer has a first through hole in it; the first protecting layer is positioned, in plan, in the first through hole and the first protecting layer in the first through hole has a patterned region comprising a plurality of through holes; and the second material is more noble than the first material.

According to an aspect, there is provided a sensor mark comprising: a substrate and at least one layer; wherein a patterned region of the at least one layer is surrounded by a surrounding region, and the patterned region is for imparting a characteristic to a beam of radiation, and the at least one layer further comprises a current limiter adapted to limit the flow of electrons in the at least one layer from the patterned region to the surrounding region and vice versa.

According to an aspect, there is provided a sensor mark comprising: a substrate, at least one electrically conducting layer and an electrically insulating layer on the at least one electrically conducting layer; at least one through hole in the electrically insulating layer exposing at least one exposed region of the at least one electrically conductive layer; the at least one exposed region comprising at least one patterned region for imparting a characteristic to a beam of radiation, wherein an area in plan of the at least one patterned region is 10 times or more smaller than an area in plan of the at least one exposed region.

According to an aspect, there is provided a sensor mark comprising: a substrate, at least one electrically conducting layer and an electrically insulating layer on the at least one electrically conducting layer; at least one through hole in the electrically insulating layer exposing at least one exposed region of the at least one electrically conducting layer; the at least one exposed region comprising at least one patterned region for imparting a characteristic to a beam of radiation, wherein the at least one patterned region is displaced from the geometric centre of its corresponding exposed region.

According to an aspect, there is provided a sensor mark comprising: a substrate; a DUV absorbing layer which substantially absorbs DUV radiation and comprises a patterned region comprising a plurality of through holes for imparting a characteristic to a beam of radiation; a DUV transmissive layer which substantially transmits DUV covering a surface of the DUV absorbing layer opposite to the substrate; and edge portions preventing exposure of edges of the DUV absorbing layer at the outer edges of the through holes; wherein the edge portions are in the same plane as the DUV absorbing layer and the DUV transmissive layer covers a portion of each of the edge portions.

According to an aspect, there is provided a method manufacturing a sensor mark, the method comprising: providing a substrate with a DUV absorbing layer on a first layer on a substrate and a second layer on top of the DUV absorbing layer; first forming a pattern of through holes through the first layer, the DUV absorbing layer and the second layer; and second forming edge portions preventing exposure of edges of the DUV absorbing layer at the outer edges of the through holes.

According to an aspect, there is provided a lithographic projection apparatus, comprising: a support table configured to support an object; a projection system configured to project a patterned radiation beam onto the object; a fluid handling structure configured to confine an immersion liquid to a space between the projection system and the support table and/or the object; an electrical power supply configured to supply a bias voltage between the object and the fluid handling structure, the electrical power supply forming an electrical circuit comprising the electrical power supply, the fluid handling structure, the object and the immersion liquid in the space; and a current limiter adapted to suppress current flowing in the electrical circuit when the object passes under a facing surface of the fluid handling structure.

According to an aspect, there is provided a sensor mark comprising: a substrate having: a first deep ultra violet (DUV) absorbing layer on the substrate comprising a first material which substantially absorbs DUV radiation and comprising a plurality of through-holes for imparting a characteristic to a beam of radiation; and a passivation layer comprising a second material covering the first DUV absorbing layer thereby to prevent exposure of edges of the first DUV absorbing layer at the outer edges of the through-holes and/or a top surface of the first DUV absorbing layer, wherein: the second material is more noble than the first material.

According to an aspect, there is provided a method manufacturing a sensor mark, the method comprising: providing a substrate with a DUV absorbing layer comprising a first material; first forming a pattern of through-holes through the DUV absorbing layer; and immersing at least a portion of the DUV absorbing layer including the pattern of through-holes in a passivation treatment solution thereby forming a passivation layer comprising a second material covering the first DUV absorbing layer thereby to prevent exposure of edges of the first DUV absorbing layer at the outer edges of the through-holes and/or a top surface of the DUV absorbing layer, wherein: the second material is more noble than the first material.

Brief Description of the Drawings Embodiments of the invention will now be described, by way of example only, with reference to the accompanying schematic drawings in which corresponding reference symbols indicate corresponding parts, and in which:

FIG. 1 schematically depicts a lithography apparatus;

FIG. 2 schematically depicts a fluid handling structure for use in the lithographic apparatus;

FIGS. 11A-11C show, in plan, a conventional transmissive sensor marks in the top right hand corner and three transmissive sensor marks according to an embodiment;

FIGS. 15A-15B illustrate schematically in two views from underneath a fluid handling structure two embodiments of the coating of FIG. 14;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include:

a programmable mirror array; more information on such mirror arrays is given in U.S. Pat. Nos. 5,296,891 and 5,523,193, which are incorporated herein by reference; and a programmable LCD array; an example of such a construction is given in U.S. Pat. No. 5,229,872, which is incorporated herein by reference.

Figure 1:
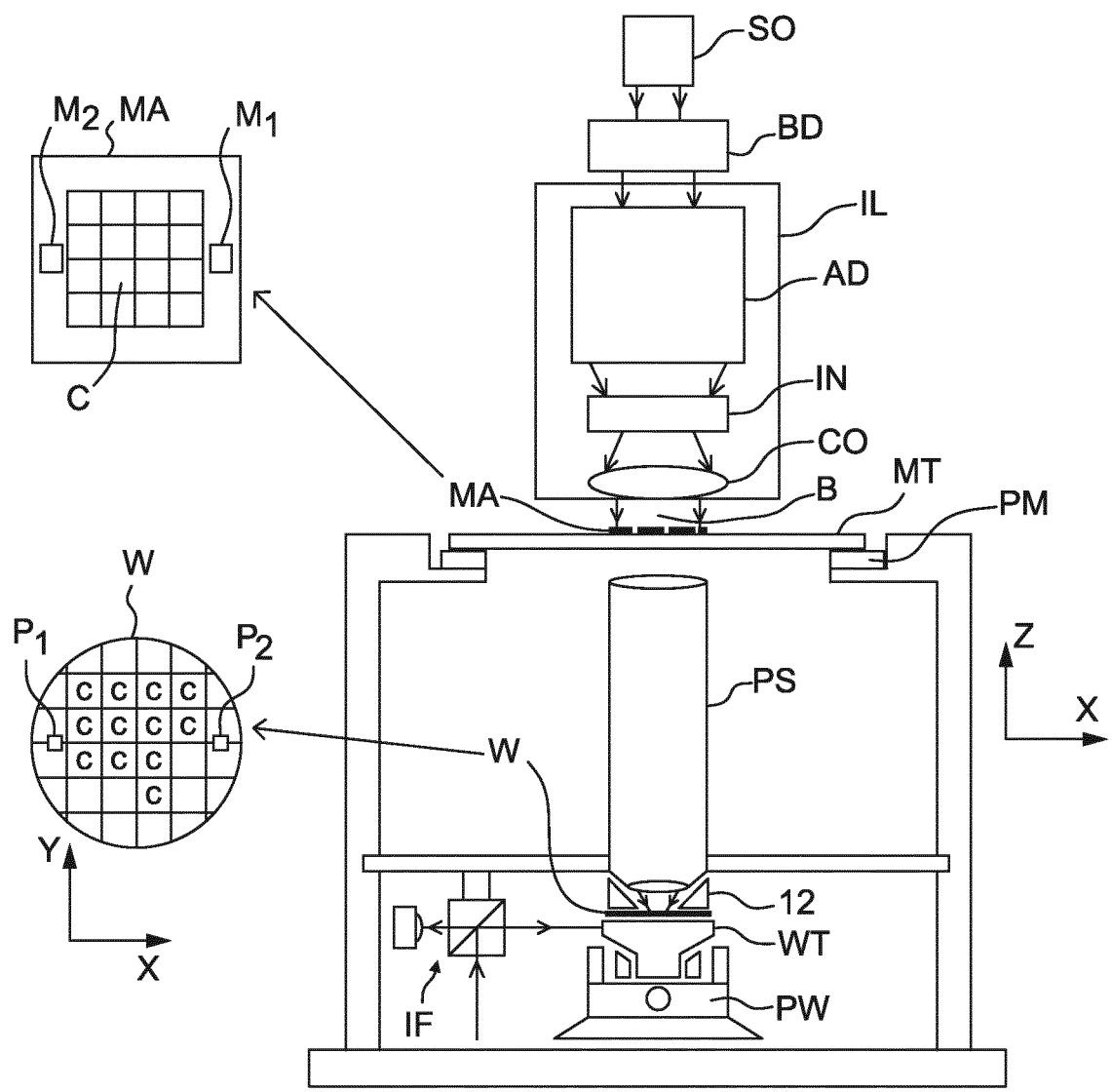

FIG. 1 schematically depicts a lithography apparatus. The apparatus includes, optionally, an illumination system (illuminator) IL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a support table (e.g. a wafer table) WT or "substrate support" or "substrate table" constructed to hold a substrate (e.g. a resist-coated wafer) W and connected to a second positioning device PW under control of positioner 130 configured to accurately position the substrate in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

In operation, an illuminator IL receives a radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus may be of a type having two or more support tables WT, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the fluid handling structure).

In operation, the radiation beam B is incident on the patterning device MA, which is held on the support structure MT, and is patterned by the pattern (design layout) present on patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder, 2-D encoder or capacitive sensor), the support table WT can be moved accurately, e.g. so as to position different target portions C in the path of the radiation beam B at a focused and aligned position. Similarly, a first positioner PM and another position sensor (which is not explicitly depicted in FIG. 1) can be used to accurately position the patterning device MA with respect to the path of the radiation beam B. Patterning device MA and substrate W may be aligned using patterning device alignment marks M1, M2 and substrate alignment marks P1, P2. Although the substrate alignment marks M1, M2 as illustrated occupy dedicated target portions, they may be located in spaces between target portions C (these are known as scribe-lane alignment marks).

The lithographic apparatus further includes a control unit which controls all the movements and measurements of the various actuators and sensors described. The control unit also includes signal processing and data processing capacity to implement desired calculations relevant to the operation of the lithographic apparatus. In practice, the control unit will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
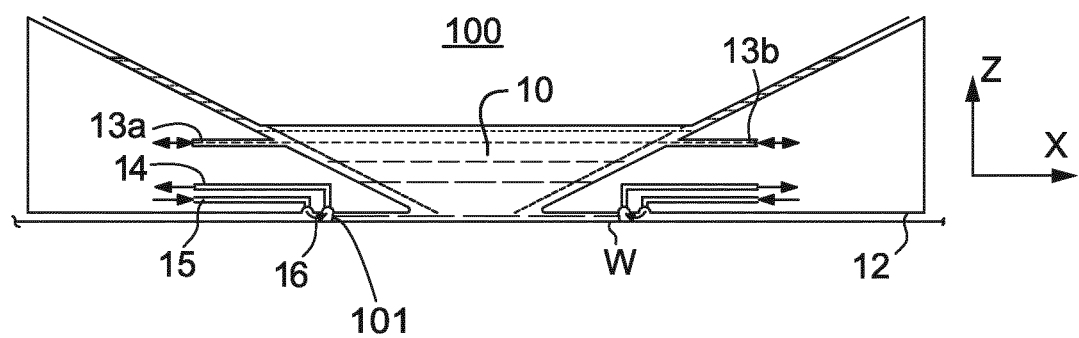

In an arrangement which has been proposed for a localized immersion system a fluid handling structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the fluid handling structure 12. The fluid handling structure 12 extends along at least a part of a boundary of the immersion space 10 between the final optical element 100 of the projection system PS and the support table WT or substrate W. In an example, a seal is formed between the fluid handling structure 12 and the surface of the substrate W/support table WT. The seal may be a contactless seal such as a gas seal 16 (such a system with a gas seal is disclosed in EP1,420,298) or a liquid seal.

The fluid handling structure 12 is configured to supply and confine immersion fluid, e.g., liquid, to the immersion space 10. Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the support table WT.

Immersion fluid may be contained in the immersion space 10 by the gas seal 16 which, during use, is formed between the bottom of the fluid handling structure 12 and the facing surface of the table (i.e. the surface of the substrate W and/or the surface of the support table WT). The gas in the gas seal 16 is provided under pressure via gas inlet 15 to a gap between the fluid handling structure 12 and substrate W and/or support table WT. The gas is extracted via a channel associated with gas outlet 14. A meniscus 101 forms at a boundary of the immersion fluid. Such a system is disclosed in US 2004-0207824. Other fluid handling structures 12 can be used with embodiments of the present invention.

Figure 3:
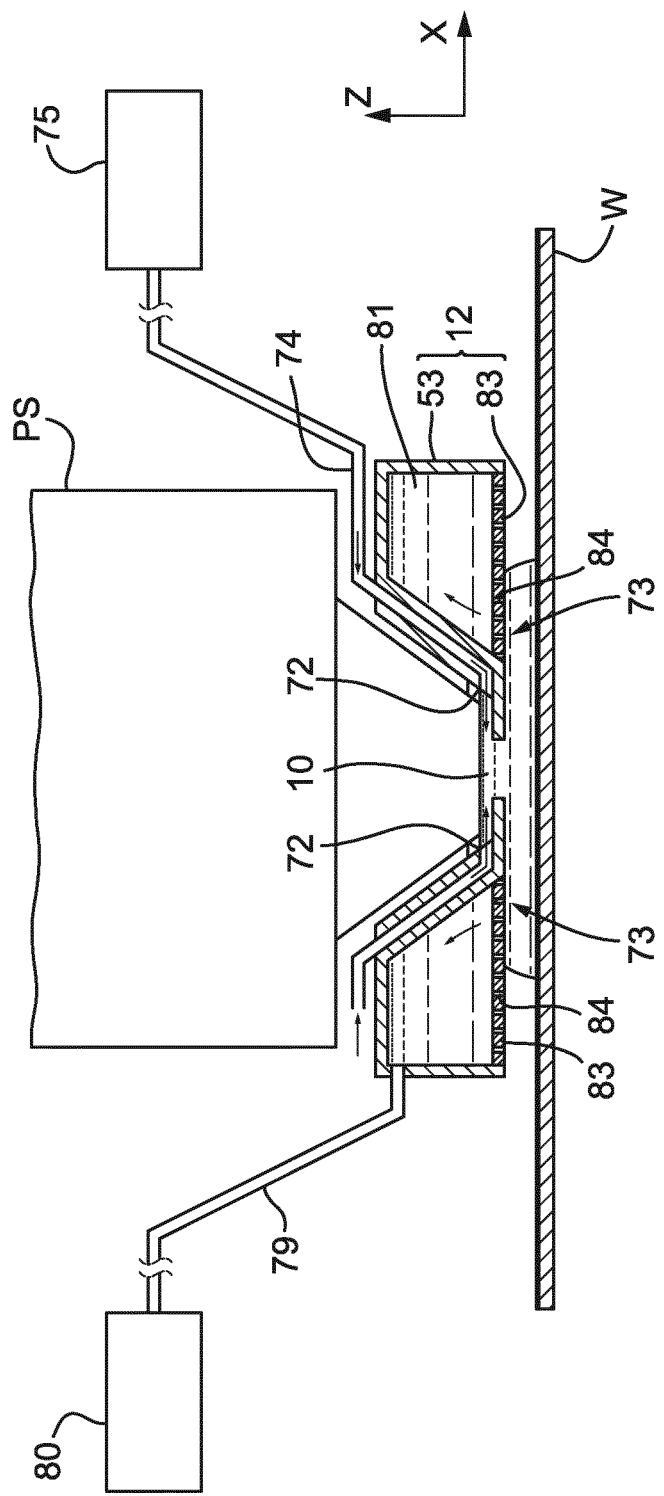
FIG. 3 is a side cross sectional view that depicts a further liquid supply system.

FIG. 3 is a side cross sectional view that depicts a further liquid supply system or fluid handling system according to an example. The arrangement illustrated in FIG. 3 and described below may be applied to the lithographic apparatus described above and illustrated in FIG. 1. The liquid supply system is provided with a fluid handling structure 12 (or a liquid confinement structure), which extends along at least a part of a boundary of the space 10 between the final element of the projection system PS and the support table WT or substrate W.

The fluid handling structure 12 at least partly confines the immersion liquid in the space 10 between the final element of the projection system PS and the substrate W. The space 10 is at least partly formed by the fluid handling structure 12 positioned below and surrounding the final element of the projection system PS. In an example, the fluid handling structure 12 comprises a main body member 53 and a porous member 83. The porous member 83 is plate shaped and has a plurality of holes (i.e., openings or pores). In an example, the porous member 83 is a mesh plate wherein numerous small holes 84 are formed in a mesh. Such a system is disclosed in US 2010-0045949 A1, which is hereby incorporated by reference in its entirety.

The main body member 53 comprises supply ports 72, which are capable of supplying the immersion liquid to the space 10, and a recovery port 73, which is capable of recovering the immersion liquid from the space 10. The supply ports 72 are connected to a liquid supply apparatus 75 via passageways 74. The liquid supply apparatus 75 is capable of supplying the immersion liquid to the supply ports 72 through the corresponding passageway 74. The recovery port 73 is capable of recovering the immersion liquid from the space 10. The recovery port 73 is connected to a liquid recovery apparatus 80 via a passageway 79. The liquid recovery apparatus 80 recovers the immersion liquid recovered via the recovery port 73 through the passageway 79. The porous member 83 is disposed in the recovery port 73. Performing the liquid supply operation using the supply ports 72 and the liquid recovery operation using the porous member 83 forms the space 10 between the projection system PS and the fluid handling structure 12 on one side and the substrate W on the other side.

The present invention will be described below in detail with reference to a sensor mark 17 which comprises a substrate of quartz 200, one or more layers 310, 320, 330, 350 of a stack 300 for interaction with a beam of radiation and an upper layer 400 with limited hydrophilicity (sometimes called a hydrophobic coating or a coating), for example with which water has a contact angle of at least 75°, preferably of at least 90°.

Figure 4:
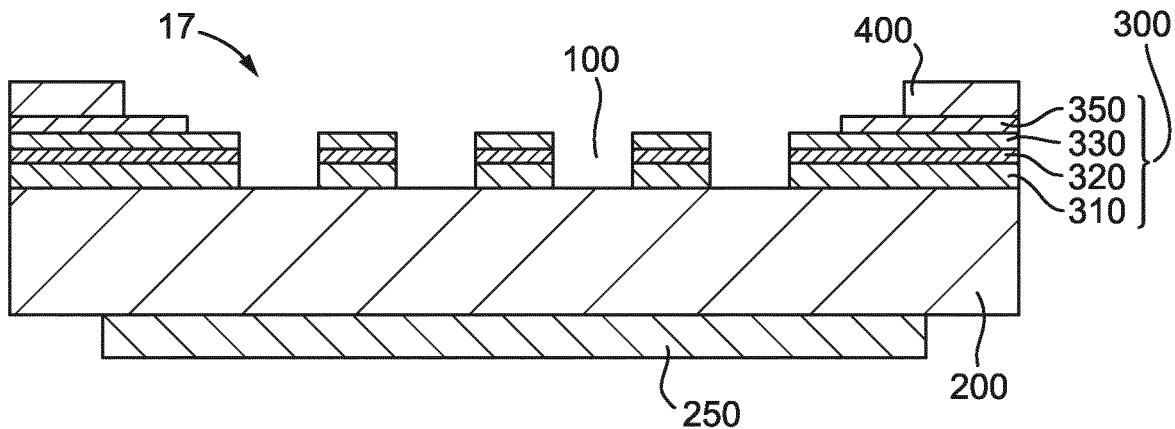
FIG. 4 is a cross-sectional view through a conventional transmissive sensor mark.
Figure 5:
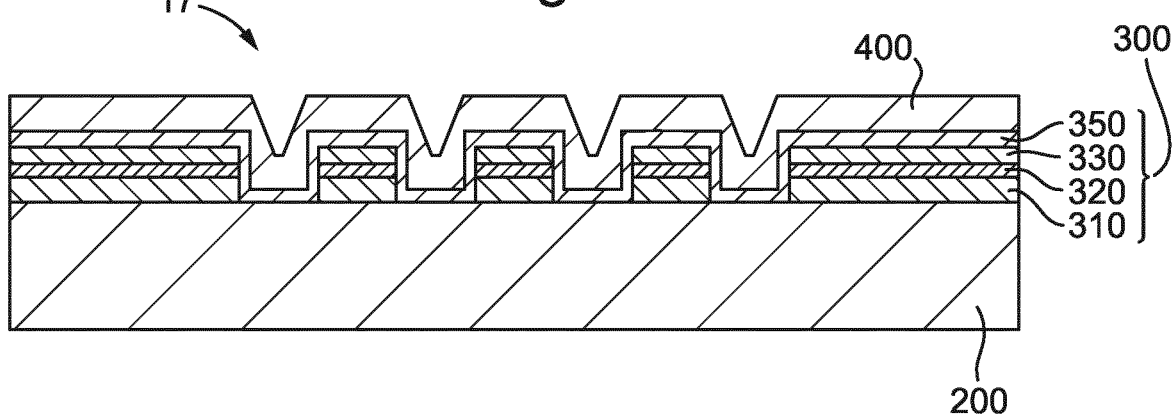
FIG. 5 is a cross-sectional view through a conventional reflective sensor mark.
Figure 6:
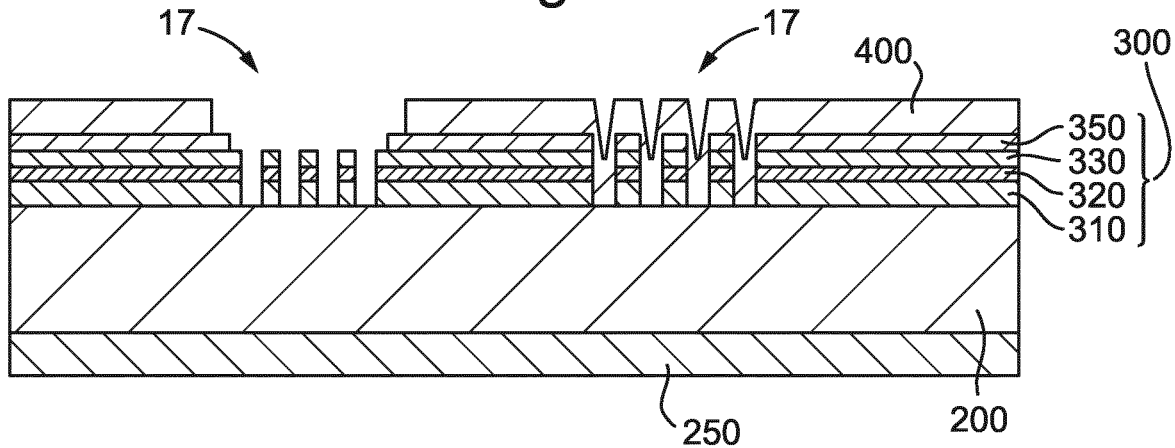
FIG. 6 shows the sensor marks of FIGS. 4 and 5 in a single quartz plate.

FIGS. 4, 5 and 6 illustrate a sensor mark 17 of the prior art formed on a substrate, e.g., quartz ($SiO_2$) plate 200. Sensor's marks are integrated into the stack 300 of thin films which is deposited on top of the quartz plate 200. The quartz plate 200 is integrated into the support table WT. The stack 300 of thin films may comprise any number of layers. As illustrated in FIGS. 4, 5 and 6, the stack 300 comprises four layers, layers 310, 320 and 330 are layers for absorbing DUV radiation projected onto the sensor mark 17 from above, as illustrated, and for absorbing radiation from underneath the quartz plate 200 which might be emitted by a material 250 under the quartz plate 200 which emits visible light when irradiated by DUV radiation. A top layer of the stack, layer 350, is formed on top of the layers 310, 320, 330 of the stack 300. In an embodiment, the layers 350 and/or 330, 320, 310 are reflective to visible and/or infra-red radiation and/or partly absorb DUV radiation.

To provide some of the measurements the sensors pass under the fluid handling structure 12 and so sensor marks 17 get covered in immersion liquid. After these measurement sensors pass under the fluid handling structure 12 again and are removed from immersion liquid. To avoid immersion liquid being left behind on the sensor marks 17 or on the stack 300 around sensor marks 17, the upper layer 400 with limited hydrophilicity is applied to the sensor mark 17 and around the sensor mark 17.

The purpose of these layers and their manufacture will now be described in more detail following an explanation of the use of the sensor mark 17 in a lithographic apparatus.

Sensor marks 17 act as:
spatial transmission filters for deep ultra violet (DUV) (PARIS, ILIAS, TIS functionality); and
spatial reflective filters for VIS, NIR, MIR (SMASH functionality).

Also, the reflection from the top surface of the stack 300 (mark-free region) can be used by other sensors.

Currently sensor marks are produced via the following sequence, with reference to FIG. 4:
1) A continuous layer of blue chromium (CrOx-Cr—CrOx) 310, 320, 330, with a total thickness of ~100 nm (e.g. 50-200 nm), is deposited on the quartz plate 200. Blue chrome 310, 320, 330 is required to minimize secondary reflections of visible light from the material 250 placed under the quartz plate 200. This material 250 converts DUV to visible light, which is captured by a sensor. DUV from the projection system PS passes through holes 100 patterned in the blue chromium 310, 320, 330. Composition for CrOx is either $Cr_2O_3$, $CrO_xN_y$ or $CrO_xN_yC_z$. The layers within blue chromium 310, 320, 330 are: bottom 310 $CrO_x$=10-80 nm thick; middle 320 Cr=5-60 nm thick; and top 330 $CrO_x$=20-100 nm thick.
2) A pattern for PARIS/ILIAS/TIS/SMASH marks (1D and 2D gratings) and other marks are lithographically-deposited and then etched in blue chromium 310, 320, 330 until quartz surface is exposed (it acts as etch-stop). Through holes 100 form the pattern.
3) A layer 350 of TiN with total thickness of up to 300 nm or less than 100 nm is deposited on top of blue chromium 310, 320, 330 and quartz plate 200, it conforms to the pattern. This TiN layer 350 will provide marks for measurements via reflection of VIS/IR, without light leaking through quartz (VIS/IR/DUV) through these marks.

4) An upper layer 400 of coating with limited hydrophilicity (e.g. an inorganic polymer with for example a Si—O—Si—O backbone preferably with methyl groups such as Lipocer®) is applied on top of the TiN layer 350. Below Lipocer is referred to (but this is not intended to be limiting). Lipocer is deposited on the TiN layer 350, which minimizes water loss, during the times the support table WT with sensor moves from under fluid handling structure 12. The upper (Lipocer) layer 400 is 50-400 nm in thickness.

5) In some spots on the sensor plate, where a high DUV dose is expected due to measurement procedure, Lipocer is not present e.g. removed (typically, a spot is ~100×100 μm² but it may also be larger, e.g. ~2×2 cm²).

Same spots will also be stripped of TiN, so to allow DUV passing to the quartz plate 200 surface and through holes 100 in blue chromium 310, 320, 330. Such spots are normally over TIS, ILIAS and PARIS (referring to FIG. 4, 5, 6).

In FIGS. 4, 5, 6:

Gratings are not in scale, the typical tile size (i.e. the size of the squares of the pattern), line width of grating is 1-10 μm.

DUV (projected through reticle marks and lens) passes through holes 100 in the blue chromium 310, 320, 330.

IR/VIS (from the source of SMASH measurement system) is mostly reflected from the interface Lipocer/TiN or TiN/blue chromium.

Level sensor is based on reflection from Lipocer and from TiN.

FIG. 4 represents a PARIS stack (and ILIAS). FIG. 5 represents a SMASH stack. FIG. 6 shows the PARIS and SMASH marks produced in the same manufacturing sequence, on the shared quartz plate 200.

To prevent galvanic corrosion of chromium of layer 320 (which forms a pair with stainless steel of the fluid handling structure 12), the whole sensor mark 17 is biased with respect to the grounded fluid handling structure 12.

Although providing an electrical bias can protect the chromium layer 320 from galvanic corrosion, any current which flows contributes to dissolution of layers of the stack 300, particularly the CrOx layers 310, 330. Additionally, the photoelectric effect results in a potentially large current when certain layers are irradiated by the DUV radiation of the projection beam B. By disconnecting the irradiated region from the surrounding, this current can be reduced. Several embodiments are described below which are aimed at reducing currents flowing in the layers of the stack 300. The embodiments can work with or without a source of bias between the chromium of layer 320 and the fluid handling structure 12, except where explicitly mentioned. In the absence of galvanic protection, the invention reduces corrosion due to a photo current. As a side effect, an advantage of having a system which does not require a bias is that any photo current induced by the photoelectric effect will be lower.

The present invention will be described below with reference to a deep ultra violet (DUV) absorbing layer comprising sub-layers 310, 320, 330. However, the present invention is equally applicable to the case where only one or two sub-layers are present in the absorbing layer and also the case where more than three sub-layers are present in the absorbing layer. For example it would be possible for the absorbing layer only to comprise a layer of chromium.

Figure 7:
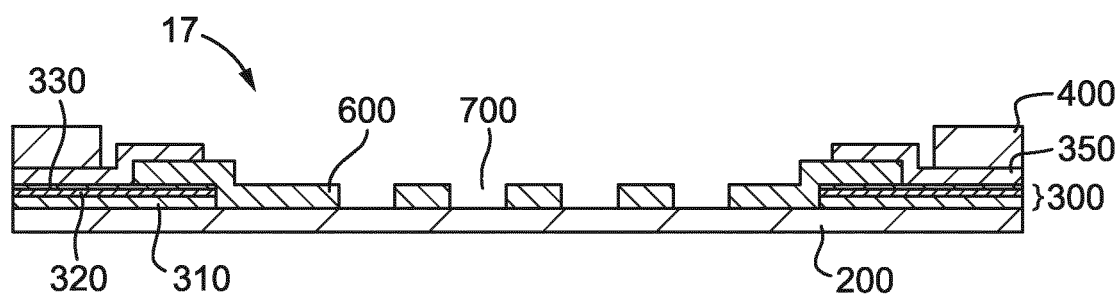
FIG. 7 is a cross-sectional view through a transmissive sensor mark of an embodiment.
Figure 8:
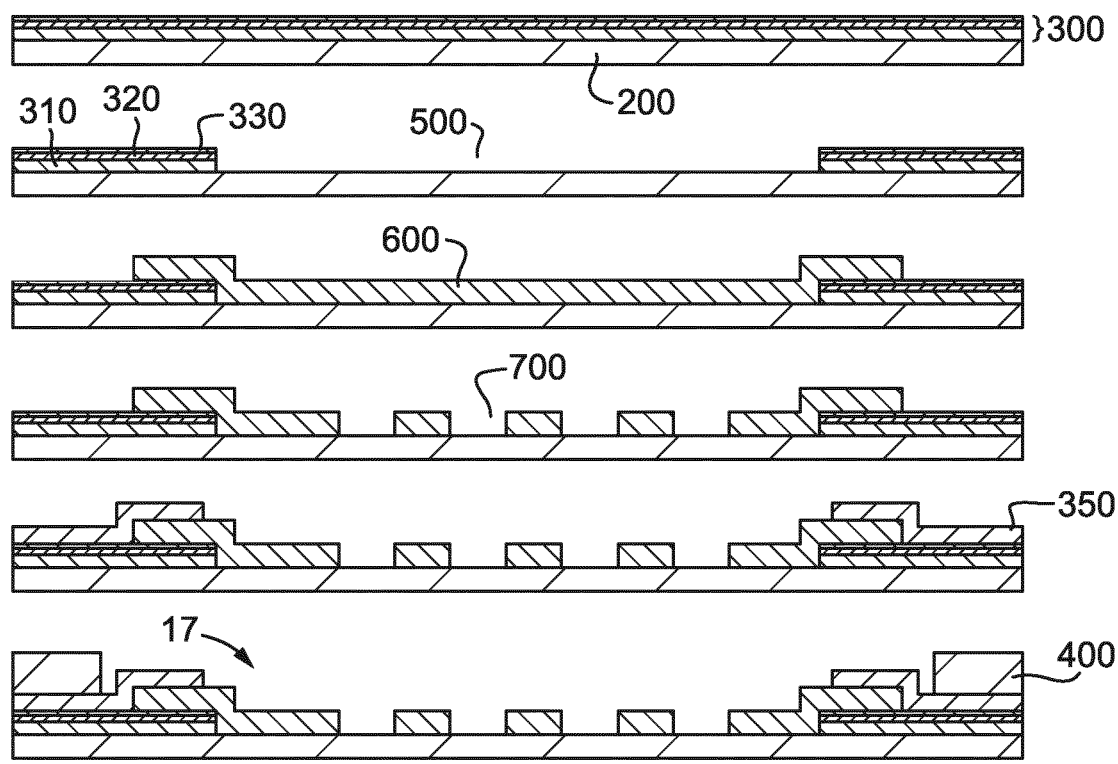
FIG. 8 shows the stages of manufacture of the transmissive sensor mark of FIG. 6 via a series of cross-sectional views.

FIGS. 7 and 8 show, in cross-section, a sensor mark 17 according to the invention of a first embodiment and a possible manufacturing flow. For simplicity, the material 250, in a form of a layer, is omitted in the figures, but in a sensor the material 250 will be present; moreover a sensor may contain several transmissive and reflecting marks that are located near (for example, closer than 1 cm) and share the quartz plate substrate 200 and the material 250 which may be a light-converting layer. The first DUV absorbing layer 310, 320, 330 comprises a first material (e.g. chromium) which substantially absorbs DUV radiation. As illustrated in FIGS. 7, 8, the first DUV absorbing layer 310, 320, 330 has a first through hole 500 in it (see FIG. 8). A first protecting layer 600 comprising a second material (that is different from the material of stacks 310, 320 and 330) is positioned in the first through hole 500. The first protecting layer 600 is in contact with the quartz plate 200. The first protecting layer 600 is then patterned to provide at least one through hole 700 in it thereby to form a patterned region comprising a plurality of through holes. The pattern of holes 700 in the first protecting layer 600 may match the pattern of through holes 100 in the currently produced sensor mark 17. Because the second material is more robust and/or resistant to degradation, oxidation and/or corrosion, namely more noble, than the first material of the first DUV absorbing layer 310, 320, 330, degradation of the sensor mark 17 will be reduced.

In an embodiment the second material of the first protecting layer 600 substantially absorbs deep ultra violet radiation. In this way the second material can replace the first deep ultra violet DUV absorbing layer 310, 320, 330 in the patterned region. By maintaining the blue chromium as the first DUV absorbing layer 310, 320, 330 around through hole 500, the properties of suppressing reflection of a range of wave lengths in the visible region at normal or grazing incidents are maintained. This is advantageous as any reflections of emission from the material 250 corresponding to different transmissive marks are suppressed and thus crosstalk between different marks is prevented.

A layer 350 (e.g. of TiN) is also present, positioned on the first DUV absorbing layer 310, 320, 330 and around through hole 500. In this embodiment the layer 350 of TiN can be seen as a second protecting layer 350. The second protecting layer 350 comprises a third material, which in one embodiment is TiN. Preferably the third material is more noble than the first material thereby to protect the first material from corrosion.

Preferably the third material of the second protecting layer 350 substantially reflects visible and/or infra-red radiation. This allows the top surface of the second protecting layer 350 to be used by sensors such as level sensors which use visible and/or infra-red radiation. Preferably the third material at least partially absorbs deep ultra violet radiation. This is an advantage such that stray DUV radiation will not be reflected around the apparatus or will not contaminate signal of transmissive marks by leaking though reflecting marks.

In the sensor mark of FIG. 7 steps may be taken electrically to isolate the first deep ultra violet (DUV) absorbing layer 310, 320, 300 from immersion liquid.

In order to protect the chromium of layer 320 from a current running between it and the fluid handling structure 12 through immersion liquid, the first deep ultra violet absorbing layer 310, 320, 330 is protected by covering it at least in part thereby to protect that part from exposure to the immersion liquid. The covering may be accomplished by the first protecting layer 600 and/or the second protecting layer 350. In an embodiment, as illustrated, the first DUV absorbing layer is fully encapsulated. However, this is not necessarily the case and areas of the first DUV absorbing layer 310, 320, 330 at lower risk of corrosion may not be covered.

The way in which the various layers are deposited will now be explained with reference to FIG. 8. The first stage 1 indicated in FIG. 8 is the deposition of the blue chromium layer 310, 320, 330 as is usual. In the second stage 2, a first through hole 500 is etched using normal techniques in the first DUV absorbing layer 310, 320, 330.

In a third stage 3, the first protecting layer 600 is deposited in the first through hole 500. As illustrated, the first protecting layer 600 is provided over the edges of the first DUV absorbing layer 310, 320, 330 thereby to cover at least a part of the first DUV absorbing layer 310, 320, 330. This prevents edges of the first DUV absorbing layer 310, 320, 330 which define the first through hole 500, from being exposed.

Next in step 4 a series of through holes 700 are developed in the first protecting layer 600 in the normal way. The plurality of through holes 700 form a patterned region in the first through hole 500. In step 5 the second protecting layer 350 is applied. The second protecting layer 350 is applied on top of the first DUV absorbing layer 310, 320, 330 as is usual and is also applied to overlap the first protecting layer 600.

In a final step 6 the upper layer 400 of coating with limited hydrophilicity is applied on top of the second protecting layer 350 in a region surrounding the first through hole 500. Alternatively, layers 350 and 400 are applied sequentially and a clear-out (for example, via reactive ion etching) is made to expose through holes 700 and the layer 600.

In an alternative embodiment, the first protecting layer 600 does not overlap the first DUV absorbing layer 310, 320, 330 at an edge surrounding the first through hole 500. Instead, the first protecting layer 600 is formed only in the first through hole 500. The second protecting layer 350 is then formed to cover substantially all of the first DUV absorbing layer 310, 320, 330 surrounding the first through hole 500. The second protecting layer 350 may also cover an edge of the first DUV absorbing layer 310, 320, 330 which defines the first through hole 500. The second protecting layer 350 may be applied such that it is in contact with the quartz plate 200. The second protecting layer 350 may be applied such that it does or does not overlap the first protecting layer 600 in the first through hole 500.

In a further embodiment, the second protecting layer 350 may be applied before the first protecting layer 600. In this way, instead of the second protecting layer 350 overlapping the first protecting layer 600, the first protecting layer 600 will overlap the second protecting layer 350. This may be either on top of the first DUV absorbing layer 310, 320, 330 or may be on top of the quartz plate 200 inside the first through hole 500.

In an embodiment the second material is a noble metal, preferably ruthenium, rhodium, palladium, silver, iridium, platinum or gold.

In an embodiment the second material is more noble than nickel.

In an embodiment the second material comprises a ceramic, preferably oxide or nitride of a metal or mix of metals more noble than nickel.

In an embodiment the second material comprises a metalloid, preferably metal nitride or a mix of metal nitrides, preferably CrN, MoN, TiN, $Si_3N_4$, $Ge_3N_4$, AlTiN or TiAlN, HfN, TaN.

In an embodiment the second material comprises a silicide of a metal more noble than nickel, preferably MoSi, TaSi or RuSi.

In an embodiment the first protecting layer 600 is applied above a DUV absorbing layer and at least partially encapsulates the DUV absorbing layer. If the second material of the first protecting layer 600 is more noble than the material of the second DUV absorbing layer, this will be effective to protect the material of the second DUV absorbing layer.

The embodiments of FIGS. 9B-11C are intended to reduce any current which flows in the layers of the sensor mark 17 and thereby reduce the galvanic current which might flow. The Pourbaix diagram for chromium shows that chromium galvanic corrosion in the pair Cr-stainless steel can be prevented by the application of an electrical bias (for example −1V). However, this comes at the cost of the promotion of corrosion of $Cr_2O_3$ (CrOx).

The rate of CrOx (or $CrO_xN_y$) corrosion (it dissolves after conversion to $Cr_x(OH)_y^{m+}$, $Cr_x(OH)_y$ or $Cr^{n+}$) may be moderate (compared to corrosion of chromium), yet thermodynamically the stack 300 is at risk.

The typical pH of the immersion liquid, e.g., ultra-pure water (with mixed-in $CO_2$, that is used in immersion lithography tools), is in the range of 4-6. Thus a bias about −1V, applied to the stack 300 of blue chromium indeed prevents chromium dissolution, yet promotes corrosion of $Cr_2O_3$.

For galvanic corrosion one needs a current/conductivity, and indeed CrOx (or $CrO_xN_y$) should be a poor insulator:
a. $Cr_2O_3$ resistivity is $10^4$ Ohm*m,
b. $CrO_2$ resistivity is $\sim 10^{-6}$ Ohm*m:
c. CrN has similar electrical properties to TiN, its resistivity is $\sim 10^4$ Ohm*m.
d. For sake of comparison: a good insulator, $Al_2O_3$ resistivity is $10^{13}$ Ohm*m.

Thus chromium oxide (and, likely $CrO_xN_y$) is able to conduct considerable current when biased through contact to TiN and/or chromium and exposed to the immersion liquid.

The embodiments of FIGS. 9B-11C attempt to allow the maintenance of the electrical bias to protect the chromium layer 320 whilst limiting any current which flows and thereby reducing galvanic corrosion of CrOx (or $CrO_xN_y$).

FIGS. 9A-11C are schematic illustrations, in plan, of sensor marks 17 of various embodiments. In each of those Figures the top left hand part marked "A" illustrates a conventional sensor mark 17 in accordance with what is illustrated and described above with reference to FIG. 3. Each of the other drawings of FIGS. 9B-11C labelled "B", "C" and "D" represents an embodiment of the invention in which measures are taken to limit galvanic current.

Figure 9A:
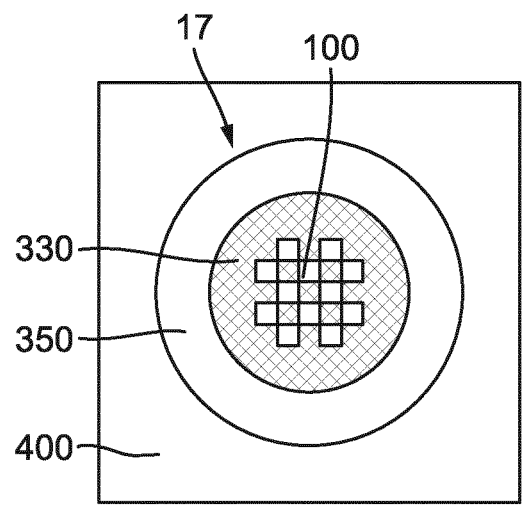
FIGS. 9A-9D show, in plan, a conventional transmissive sensor mark in the top right hand corner and three transmissive sensor marks according to an embodiment.
Figure 9B:
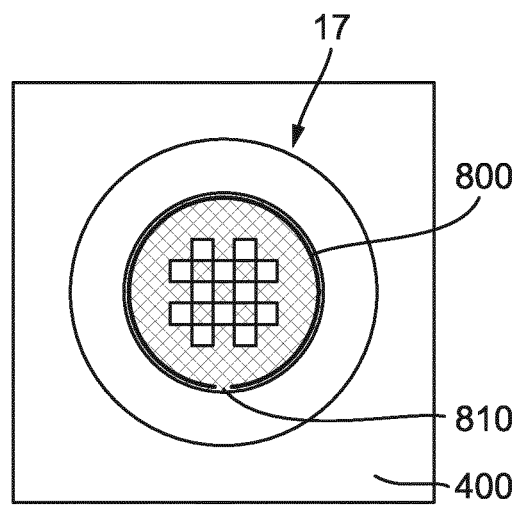
Figure 9C:
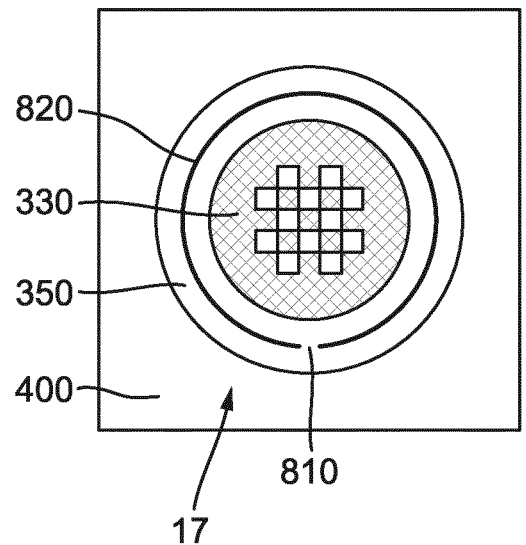
Figure 9D:
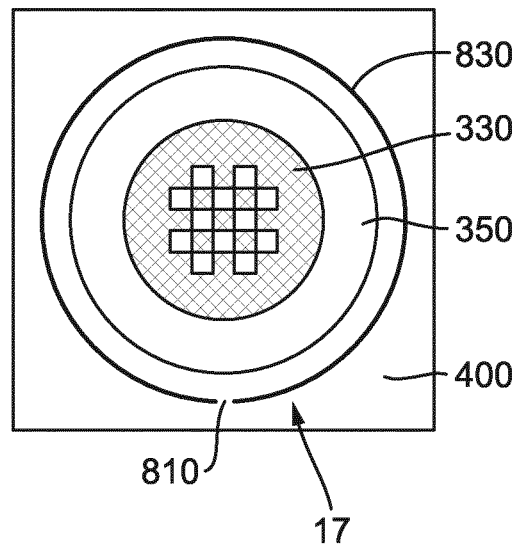
Figure 10A:
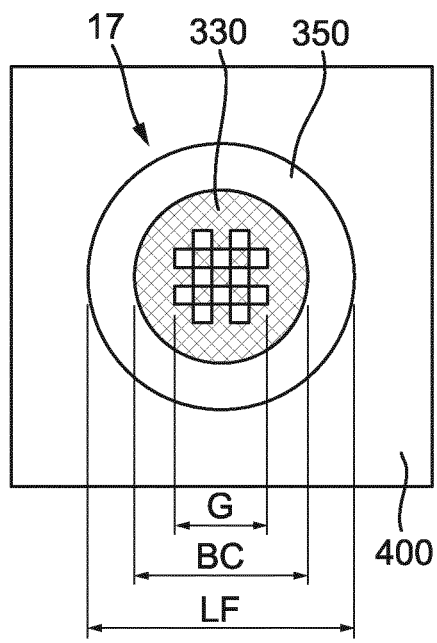
FIGS. 10A-10D show, in plan, a conventional transmissive sensor mark in the top right hand corner and three transmissive sensor marks according to an embodiment.
Figure 10B:
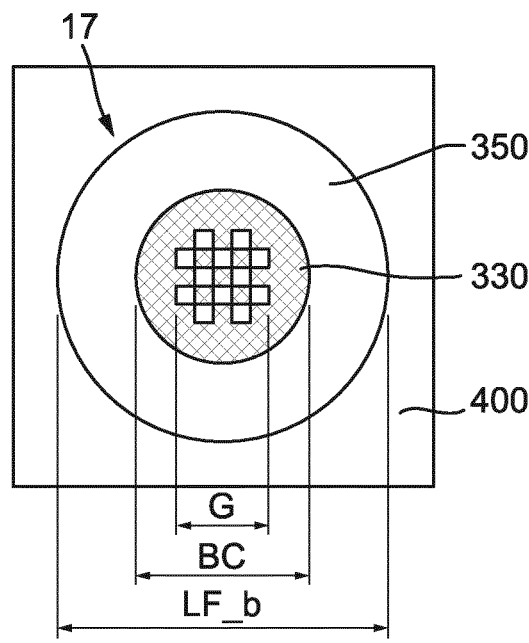
Figure 10C:
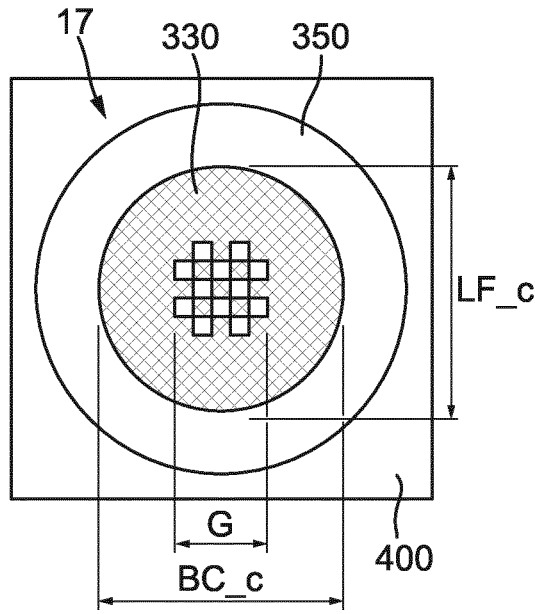
Figure 10D:
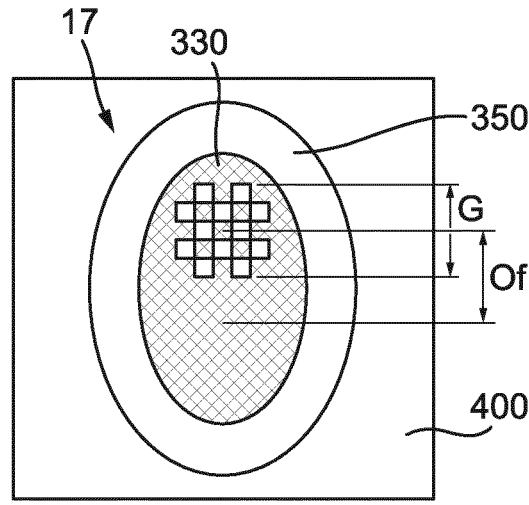

In each of the embodiments "B"-"D" of FIGS. 9B-9D a current limiter 800, 820, 830 is provided in at least one layer of the sensor mark 17. The current limiter 800, 820, 830 is effective to reduce any flow of electrons from layers exposed to immersion liquid and/or DUV radiation and which might otherwise dissolve due to the electrical bias between the chromium layer 320 and the fluid handling structure 12. The current limiter 800, 820, 830 comprises an electrically insulating region in an electrically conducting layer e.g. 310 or 320 (not visible in FIG. 9) or 330 or 350.

As can be seen, a patterned region formed by a plurality of through holes 100 is present in the first DUV absorbing layer 310, 320, 330 (of which only the top layer 330 is visible). A region surrounding the patterned region is termed a surrounding region and can be considered as the area, in plan, at the radially most outwardly edges (and beyond) as illustrated. The current limiter 800, 820, 830 limits the electrons which can flow from the patterned region to the surrounding region and vice versa. The lower the flow of electrons, the slower any dissolution rate due to the current.

In this way it is possible to protect the patterned region, which is the functionally most important region, from galvanic corrosion.

Preferably the current limiter 800, 820, 830 comprises an electrically insulating region between the patterned region and the surrounding region. In one form of the invention the current limiter 800 is a through hole in the first layer of the at least one layer (the first DUV absorbing layer 310, 320, 330). As illustrated the through hole forming the current limiter 800, 820, 830 is a through hole through all of the layers making up the sensor mark 17 at the position where the current limiter 800, 820, 830 is formed. However, this needs not be the case and in the case of the presence of non electrically conducting layers (e.g. the upper layer 400 of limited hydrophilicity), the through hole does not need to extend through those layers.

As illustrated, the current limiter 800, 820, 830 substantially surrounds the patterned region. In an embodiment, in order easily to be able to apply an electrical bias to the patterned region via the surrounding region, an electrically conducting bridge 810 is provided between the patterned region and the surrounding region. The electrically conducting bridge 810 allows the conduction of electrons from the patterned region to the surrounding region, but due to its limited size, limits the current which can pass between those two regions. As illustrated, the electrically conducting bridge 810 is simply a portion of the layers which is not removed during formation of the through hole which forms the current limiter 800, 820, 830.

The difference between the embodiments of FIGS. 9 "B", "C" and "D" is the position of the current limiter 800, 820, 830. In the embodiment of FIG. 8 "B" the current limiter 800 is formed only in the first DUV absorbing layer 310, 320, 330 which forms the patterned region. A region of exposed layer 350, optionally formed of TiN, surrounds the current limiter 800, followed by a region covered in the upper layer 400 of limited hydrophilicity, e.g., Lipocer.

In the embodiment of FIG. 9 "C" the current limiter 820 is formed through the layer 350 (e.g. of TiN) as well as through the first DUV absorbing layer 310, 320, 330. In the embodiment of FIG. 9 "D" the current limiter 830 is formed through all of the layers forming the sensor mark 17.

The embodiments of FIGS. 9B-11C can be used with an electrical bias but also without an electrical bias. In the case of no electrical bias the invention of FIGS. 9B-11C works by reducing the photo induced current which results from DUV exposure of the first DUV absorbing layer 310, 320, 330.

In the case of the current limiter 800, 820, 830 being in the form of a through hole, this will be transparent to DUV and visible light. Thus the through hole is preferably sufficiently removed from the patterned region in order to prevent loss of contrast or signal smearing by leaking of DUV radiation. Therefore preferably the through hole forming the current limiter 800, 820, 830 is removed from the patterned region by at least 10 tile sizes (e.g. grating pitch sizes). Preferably the width of the through hole is smaller than the tile size, preferably less than half the tile size and more preferably less than a quarter of the tile size.

The embodiment of FIGS. 10A-10D works on the understanding that the layers of the first DUV absorbing layer 310, 320, 330 are conducting, that the layer 350 of TiN is also conducting, but that the layer 400 is non-conducting. If the area of the patterned region compared to the area of a conducting exposed region is small, that dissolution in the patterned region will be reduced compared to the case where the relative area of the patterned region compared to the conducting exposed region is higher. This is due to the fact that galvanic corrosion scales with the galvanic current density, integrated over time, thus:

$$\text{The improvement of life-time should scale} \sim \left( \frac{S_{new-conducting}}{S_{old-conducting}} \right)^{0.5}$$

By ensuring that an area in plan of the at least one patterned region (indicated by dimension G in FIG. 10) is at least ten times smaller than an area in plan of the at least one exposed region (indicated in FIG. 10 by dimension LF), corrosion of the patterned region can be significantly reduced. The upper layer 400 of limited hydrophilicity can be seen as an electrically insulating layer. Therefore, the extent to which the upper layer 400 of limited hydrophilicity leaves the layer 350 of TiN and the first DUV absorbing layer 310, 320, 330 exposed to immersion liquid can be seen as an exposed region with dimension LF in FIG. 9 "A". The exposed region is a region in which at least one electrically conductive layer (layer 350 (e.g. of TiN) and first DUV absorbing layer 310, 320, 330 in the case of FIG. 10) is exposed.

In FIG. 10 "A" it can be seen that the patterned region has a dimension G and the conducting exposed surrounding region has a dimension LF. Therefore the ratio of the area of the patterned region to the electrically conducting surrounding region is $G^2:LF^2$.

FIGS. 10 "B", "C", "D" and FIG. 11 "B" and "C" show embodiments of how this ratio can be improved. FIG. 10 "D" additionally shows how introducing an asymmetric nature to the shape, in plan, and the positioning of the patterned region relative to the surrounding region can yet further reduce galvanic corrosion.

In the embodiment of FIG. 10 "B" the area of the exposed region is increased by reducing the proximity which the upper layer 400 of limited hydrophilicity gets to the patterned region. Therefore a greater area of layer 350 of TiN is exposed. However, the amount of exposed first DUV absorbing layer 310, 320, 330 remains the same. An additional benefit is that the wider opening in the upper layer 400 of limited hydrophilicity improves chemical stability of the layers 310, 320, 330, 350 which are exposed to DUV. An interaction of the material of the upper layer 400 of limited hydrophilicity, ultra pure water of the immersion liquid and DUV radiation from the projection beam B deteriorates the blue chromium layers 310, 320, 330 and/or etches the quartz of the quartz plate 200 (exposed by the through holes in the blue chromium).

In the embodiment of FIG. 10 "C" additionally the amount of exposed area of first DUV absorbing layer 310, 320, 330 is increased.

In the embodiments of FIGS. 11B-11C, the area of the at least one exposed region is increased compared to the patterned region by including exposed regions (in the bottom half of FIGS. 11 "B" and "C") which do not comprise a patterned region. In the embodiment of FIG. 10 "B" only the layer 350 of TiN is exposed whereas in the embodiment of FIG. 10 "C" both the layer 350 of TiN is exposed as well as the first DUV absorbing layer 310, 320, 330.

In the embodiments of FIGS. 11B and 11C the non-patterned exposed regions are sized and positioned such that they are covered in immersion liquid during the imaging of the patterned region.

It is preferable that the distance between patterned regions (indicated as L_mark) is significantly larger than one size of grating. The area free of upper layer 400 of limited hydrophilicity (with dimension D_mark) is preferably smaller than L_mark, preferably at least two times smaller. Although only one pattern free exposed region is shown (at a distance of L_offset) in FIGS. 11B-11C for each patterned exposed region, in reality any number of non-patterned exposed regions may be provided for each patterned exposed region. In an embodiment the ratio lies between 1:1 and 1:100 with a preferred range lying between 1:2 and 1:20. In this way it is possible to arrange D_mark≤L_offset≤L_mark. In an embodiment the size of the un-patterned exposed regions is comparable to or larger than the patterned region size D_mark.

In FIG. 10 "D" a further feature is illustrated which may be used in combination with the feature illustrated in the remainder of FIGS. 10B-10D and 11B-11C or may be used independently thereof.

In the embodiment of FIG. 10 "D" the patterned region is displaced away from the geometric centre of its corresponding exposed region. Thus an asymmetry is introduced. This arrangement increases the chance that any current flowing does not flow in the patterned region. Additionally it will increase the chance of the patterned region staying contamination free (due to water droplets remaining in the exposed region after the sensor mark 17 has been moved away from the fluid handling structure 12) because the droplets move away from the patterned region. Preferably the maximum dimension G of the patterned region is smaller than a distance between the geometric centre of its exposed region and the geometric centre of the patterned region. Effectively dimension G is smaller than dimension Of in FIG. 10 "D".

The embodiments of FIGS. 10B-10D and 11B-11C reduce the galvanic current density. The overall galvanic current may increase because of the increased size of the exposed region and thus reduced resistance of the immersion liquid, but the galvanic current density will decrease due to an increase in the area for the galvanic current to travel through. Thus corrosion of the patterned region will be reduced.

Figure 12:
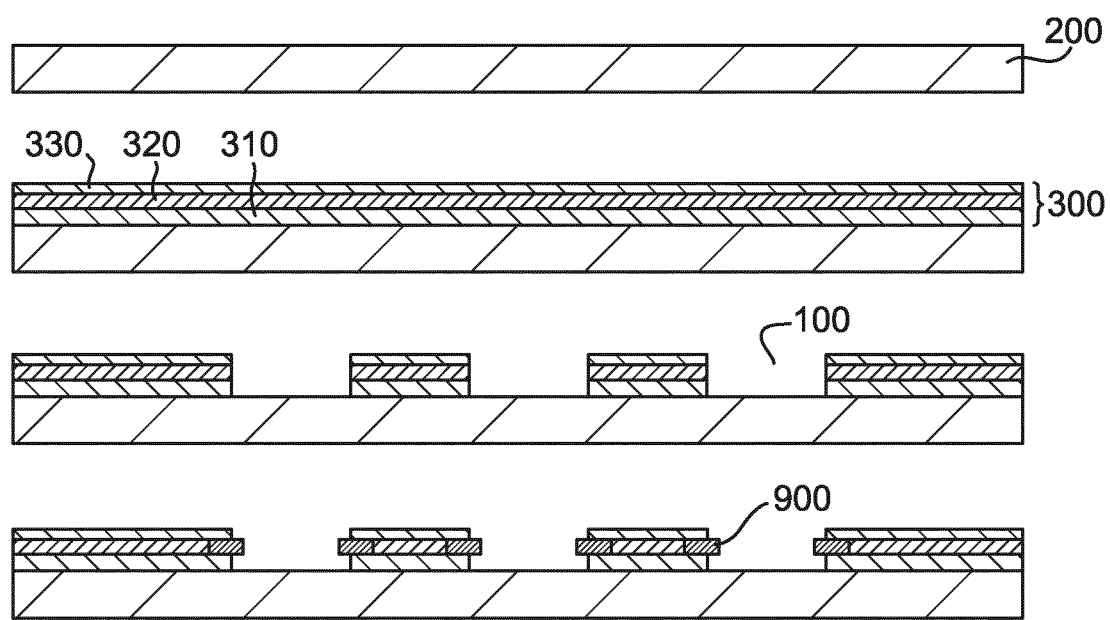
FIG. 12 illustrates in cross-section the steps of manufacture of a transmissive sensor mark of an embodiment.

In the embodiment of FIG. 12 edge portions 900 are provided in the same plane as the chromium layer 320 of the blue chromium. The edge portions 900 prevent exposure of edges of the chromium layer 320 which is DUV absorbing. Preferably the edge portions 900 are comprised of the same material as the layers 310, 330. In this way an electrical bias can be provided to the stack 300 which is suited for protection of the material of layers 310, 330 and the edge portions 900 such that galvanic corrosion can be prevented.

FIG. 12 shows four main manufacturing steps. A quartz plate 200 is provided onto which a blue chromium stack 300 comprising layers 310, 320, 330 is deposited in the same way as step 1 of FIG. 7. A plurality of through holes 100 is then formed by usual techniques in the blue chromium layer in step 3. This forms a patterned region for imparting a characteristic to a beam of radiation.

In order to protect the chromium in the chromium layer 320 which is the primary DUV absorbing material of the stack 300, edge portions 900 are formed around the edge of the through holes 100 thereby preventing exposure of edges of the chromium layer 320. The edge portions 900 are in the same plane as the chromium layer 320 (and are substantially absent from other planes). Additionally the edge portions 900 extend under the top layer 330 of the stack 300 and over the bottom layer 310 of the stack 300. Thus the top (DUV transmissive) layer 330 covers a portion of each of the edge portions 900 and the bottom (DUV transmissive) layer 310 is covered by a portion of the edge portions 900.

In an embodiment the edge portions 900 are formed in step 4 by oxidation and/or nitridization of the chromium within the chromium layer 320 by an oxygen/nitrogen plasma or high temperature annealing in an oxygen or nitrogen rich atmosphere, after litho-etch patterning of the blue chromium shown in FIG. 12 step 3.

Figure 13:
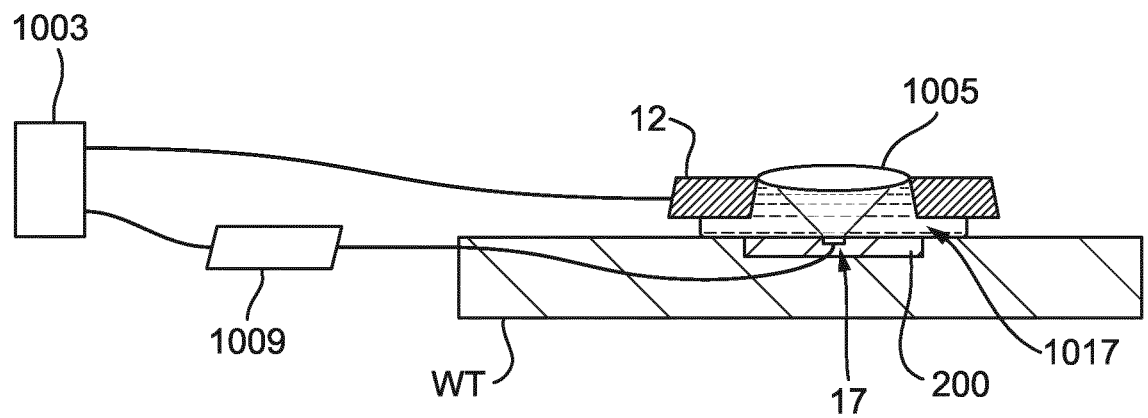
FIG. 13 illustrates schematically and in cross-section an embodiment of the invention.

The embodiment of FIG. 13 may be used in conjunction with or in isolation from the other embodiments. The same is true of the embodiment of FIGS. 14 and 15A-15B. All embodiments of FIGS. 13-15B include current limiters in a galvanic protection system which is adapted to suppress current flowing in the electrical circuit of the galvanic protection system.

Figure 14:
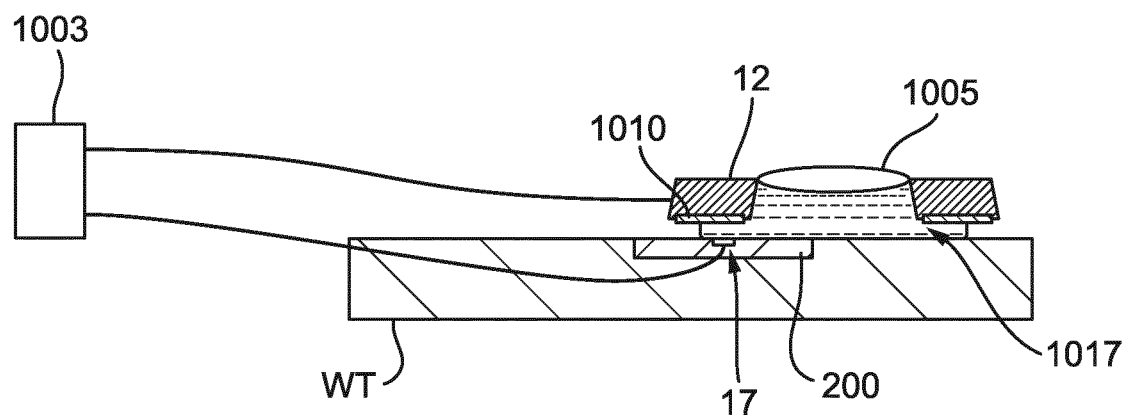
FIG. 14 illustrates schematically and in cross-section an embodiment of the present invention.

In the case of the FIG. 13 embodiment, current is limited for the entire time that the sensor mark 17 is covered by immersion liquid. In the embodiments of FIGS. 14 and 15A-15B, current is limited in particular when the sensor mark 17 passes under a facing surface of the fluid handling structure 12. When the sensor mark 17 passes under a facing surface of the fluid handling structure 12 (a situation illustrated in FIG. 14) this is the time that the highest current is likely to flow in the galvanic protection circuit because of the small thickness of immersion liquid between the fluid handling structure 12 and the sensor mark 17 (and so the low resistance).

Although in FIGS. 13-14B the embodiments are described with reference to a sensor mark 17, the invention can be applied to any object on the support table WT.

In the embodiments of FIGS. 13-15B an electrical power supply 1003 is configured to supply a bias voltage between the sensor mark 17 and the fluid handling structure 12. Thus an electrical circuit is formed comprising the electrical power supply 1003, the fluid handling structure 12 and the sensor mark 17 with immersion liquid completing the circuit when the sensor mark 17 is under the fluid handling structure 12.

In the embodiment of FIG. 13 a current limiter 1009 is provided in the circuit. Thus the galvanic current is limited, whilst preserving the bias. The bias protects the layer 320, while it is in contact with immersion liquid, and the current limiter minimizes damage of the stacks 310, 330, while the sensor is passing under the fluid handling structure 12.

The current limiter 1009 comprises a resistor hard wired in series in the circuit. The resistor is adapted to increase the resistance in the electrical circuit. This thereby suppresses the current flowing in the electrical circuit, particularly when the object passes under the facing surface of the fluid handling structure 12 (a position illustrated in FIG. 14).

In an embodiment the resistor may be a ballast resistor meaning that its resistance increases as the current increases. This means that a suitable bias will remain whatever the position of the sensor mark 17 relative to the fluid handling structure 12.

In an alternative embodiment the resistor 1009 may be a thyristor which will operate in a similar way as it will heat up (and so increase in resistance) as current flows in the circuit. A different sort of variable resistor may be used, for example a variable resistor whose resistance is varied by a control system dependent upon the relative position of the sensor mark 17 and the fluid handling structure 12.

In the embodiment of FIG. 14, the current limiter 1010 comprises a coating on a portion of the facing surface of the fluid handling structure 12 under which the sensor mark 17 passes. The coating is at least partly electrically insulating meaning that even when the sensor mark 17 is in close proximity to the facing surface (and the amount of immersion liquid in the circuit and so resistance is small), the current flowing will not dramatically increase.

FIGS. 15A-15B show two possible embodiments of the current limiter 1010 in a form of the coating, looking at the facing surface from underneath. In FIG. 15A the coating is only applied to a small portion of the facing surface under which the sensor mark 17 will pass as the sensor mark 17 moves under the projection system PS. This system works well if the controller controlling the position of the support table WT always ensures that the sensor mark 17 passes under the same portion of the facing surface (that portion which has a coating applied). In an embodiment the coating may have a thickness in the range of 0.1 to 50 nm.

The embodiment of FIG. 15B is different in that this allows the sensor mark 17 to pass under any portion of the facing surface and still be protected by the presence of the coating. In the embodiment of FIG. 15B, the coating covers the entire facing surface.

Preferably the coating thickness is in the range of 0.1-10 μm (much smaller than the fly height of the fluid handling structure 12 over the top surface of the support table WT). This avoids the need to re-design the fluid handling structure 12.

Preferably, bulk resistance of the coating material should exceed $10^{10}$ Ohm*m (consider a 1 μm thick layer, the resistance of a patch of insulating material above the sensor ~W*W (1 cm$^2$×1 μm) is $$R = 10^{10} 0 \text{ hm} * m * \frac{10^{-6}}{1 \text{ cm}^2} = 100 \text{ MOhm}$$

The resistance is sufficient to prevent a spike of galvanic current during the times when the sensor mark 17 passes under the fluid handling structure 12 and the resistance of the immersion liquid is the smallest The coating can be interrupted for holes that support gas knife operation as well as water supply and suction of the fluid handling structure 12. Their area is very small, compared to the fluid handling structure 12 surface (or liquid confinement structure 12 surface in vicinity of sensor mark 17), so current, collected by them is also small.

Good candidates for insulating layer are $B_2O_3$, $Al_2O_3$, $Ga_2O_3$ and $SiO_2$, (they all feature resistivity ~$10^{13}$ Ohm*m or more and are compatible with the immersion liquid such as UPW). High resistivity also makes it easier to allow thinner coating which is intrinsically stronger by lower stress and less prone to flacking off.

Another good candidate for coating may be Lipocer (provided a good adhesion between it and fluid handling structure 12 is realized), the benefit is ease of application.

Figure 16:
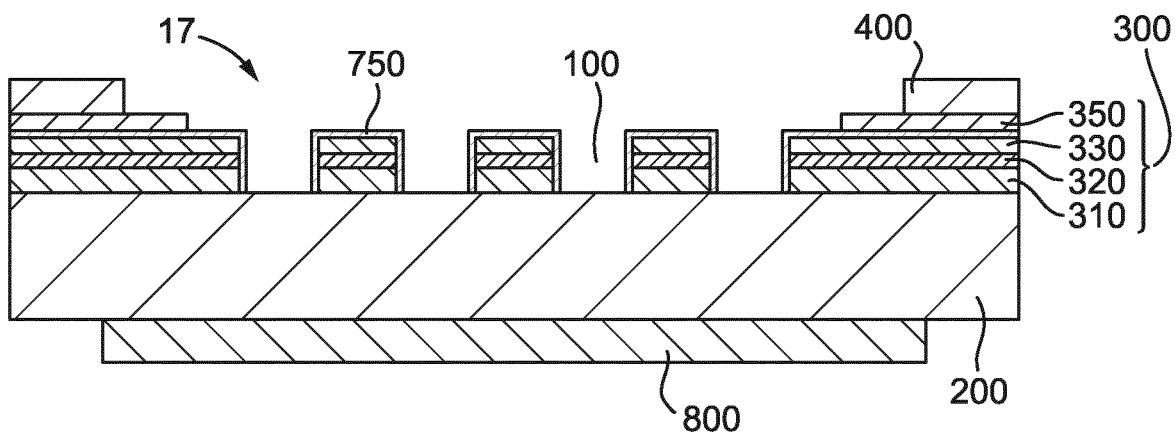
FIG. 16 is a cross-sectional view through a transmissive sensor mark according to an embodiment.
Figure 17:
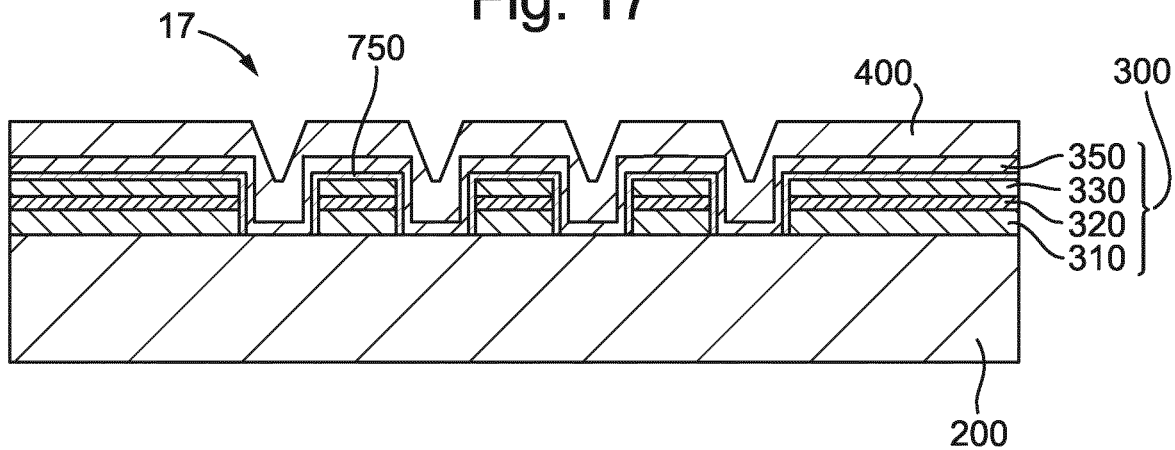
FIG. 17 is a cross-sectional view through a reflective sensor mark according to an embodiment.
Figure 18:
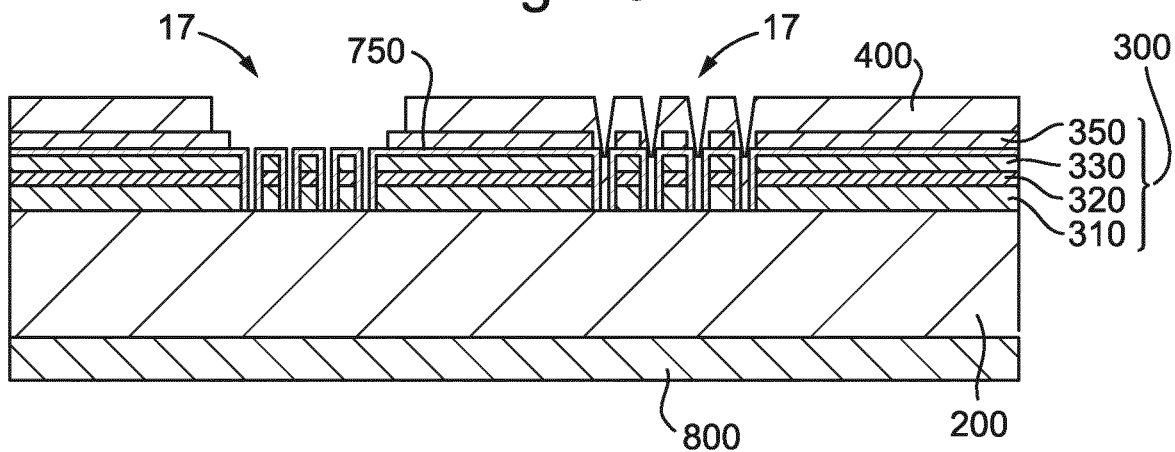
FIG. 18 shows the sensor marks of FIGS. 16 and 17 on a single quartz plate.

The embodiment of FIGS. 16-18 is similar to the embodiment of FIGS. 7 and 8 except as described below. The first DUV absorbing layer 310, 320, 330 is the same as described with reference to FIGS. 4-8. After the DUV absorbing layer 310, 320, 330 has been deposited and had a plurality of through-holes 100 manufactured into it for imparting a characteristic to a beam of radiation, a layer in the form of a passivation layer 750 is applied to the first DUV absorbing layer 310, 320, 330. The material of the passivation layer 750 is more noble than the first material (e.g. chromium) of the first DUV absorbing layer 310, 320, 330. In an embodiment the passivation layer 750 is relatively thin compared to the thickness of each of the individual layers making up the first DUV absorbing layer 310, 320, 330. In an embodiment, the passivation layer 750 is 0.5-50 nm thick, preferably 10-20 nm thick. In an embodiment the passivation layer 750 is 100 nm thick or less, advantageously to avoid blocking the through-holes 100. A minimum thickness of the passivation layer 750 of at least 0.5 nm, preferably at least 2 nm, more preferably at least 5 nm ensures the layer is sufficiently robust. In an embodiment the passivation layer 750 is thicker than 100 nm and the through-holes 100 are initially formed with a layer size to accommodate the thicker passivation layer 750. The thickness of the passivation layer 750 may not be uniform. In an embodiment the passivation layer 750 is thicker on top of the absorbing layer 310, 320, 330, compared to where the passivation layer 750 is formed on the outer edges of the through-holes 100.

As shown in FIGS. 16-18, in an embodiment the passivation layer 750 does not form on the substrate 200. In an embodiment, if the DUV absorbing characteristics of the passivation layer 750 are low enough to be acceptable, it may also cover the substrate 200. However, the passivation layer 750 forms on all surfaces of the first DUV absorbing layer 310, 320, 330 which would otherwise be exposed. Thus the passivation layer 750 prevents exposure (e.g. direct contact with the immersion liquid) of edges of the first DUV absorbing layer 310, 320, 330 at the outer edges of the through-holes 100. The passivation layer 750 also prevents exposure (e.g. direct contact with the immersion liquid) of a top surface of the first DUV absorbing layer 310, 320, 330.

Optionally a TiN layer 350 may be formed on top of the passivation layer 750 (on top of the first DUV absorbing layer 310, 320, 330). An upper (Lipocer) layer 400 may optionally be formed on top of the passivation layer 750 (e.g. on TiN layer 350).

In an embodiment a layer to promote adhesion is provided between the passivation layer 750 and the TiN layer 350 and/or upper (Lipocer) layer 400. If the TiN layer 350 and/or upper (Lipocer) layer 400 are deposited after the passivation layer 750 is formed, the structure will appear like that illustrated in FIGS. 16-18. Such a structure is particularly suited to the case where the passivation layer 750 is formed by sputtering for example of a metal or a ceramic. In an alternative embodiment, particularly suited to where the passivation layer is an anodic corrosion inhibitor and/or deposited chemically (including electro-chemically and photo-electro-chemically), the TiN layer 350 and/or upper (Lipocer) layer 400 can be formed before the passivation layer 750. In that case the passivation layer 750 will not be present between the TiN layer 350/upper (Lipocer) layer 400 and the first DUV absorbing layer 310, 320, 330, but only be present on those portions (upper surface and outer edges of through-holes 100) which are exposed (i.e. uncovered by either the TiN layer 350 or the upper (Lipocer) layer 400.

In an embodiment the passivation layer 750 can be formed by electroplating; or immersing the sensor mark or spraying onto the sensor mark a passivation treatment solution, for example as described in US 2007-0243397 A1 hereby incorporated in its entirety by reference.

The passivation layer 750 may be an anodic corrosion inhibitor. In an embodiment the passivation layer 750 is an insoluble layer. Thereby the passivation layer 750 prevents an electrical connection being made between any immersion liquid and the first DUV absorbing layer 310, 320, 330. Thus the first DUV absorbing layer 310, 320, 330 is protected from degradation in a similar way to the embodiment of FIGS. 7 and 8. However, contrary to the embodiment of FIGS. 7 and 8, the pattern of through-holes 100 which imparts a characteristic to a beam of radiation is formed by the first DUV absorbing layer 310, 320, 330 (in the same way as in the conventional arrangement of FIGS. 4-6). This is advantageous because the sensor mark 17 is still compliant with previous specifications based on the plurality of through-holes 100 for imparting a characteristic to a beam of radiation being formed in the first DUV absorbing layer 310, 320, 330. Thus the anti-reflection properties of the blue chrome stack may be maintained and the proven functionality of such marks may also be maintained. In an embodiment a sensor mark such as illustrated in FIG. 6 is immersed in the passivation treatment solution. In an embodiment the passivation treatment solution is a liquid with dissolved inhibitor or its precursor.

In an embodiment the passivation layer 750 is formed after the first DUV absorbing layer 310, 320, 330 is deposited and the plurality of through-holes 100 are formed. Additionally, the passivation layer 750 may be formed after the TiN layer 350 and/or the upper (lipocer) layer 400. In an embodiment the passivation layer 750 is formed by immersing at least a portion of the first DUV absorbing layer 310, 320, 330 including the pattern of through-holes 100 in a passivation treatment solution thereby to form the passivation layer 750. The passivation treatment solution may be, for example, phosphoric acid. In an embodiment an electrical bias is applied to the first DUV absorbing layer 310, 320, 330 whilst the portion is immersed in the passivation treatment solution.

During immersion in the passivation treatment solution the first DUV absorbing layer 310, 320, 330 is optionally subjected to an electrical bias. The bias promotes deposition of inhibitor and is typically in the range of −1V to +1V SHE (or other bias in the range between $H_2$ and $O_2$ production at the given pH of the passivation treatment solution). Additionally or alternatively the first DUV absorbing layer 310, 320, 330 is irradiated with light to promote inhibitor deposition on the first DUV absorbing layer 310, 320, 330. In an embodiment inhibitor interaction with the TiN layer 350 and/or upper (Lipocer) layer 400 is avoided.

In an embodiment the passivation treatment solution has a pH in the range of 3-11. This advantageously reduces the risk of reaction with the TiN layer 350 and/or upper (Lipocer) layer 400. In an embodiment deposition time is 1-100 minutes. In an embodiment a concentration of the passivation treatment solution is 0.01 M or lower. This is advantageous as although it increases deposition time, it increases uniformity of the passivation layer thickness.

In an embodiment the passivation treatment solution is applied only to certain areas of the sensor mark. In an embodiment the rest of the sensor mark may be masked off in order to avoid contact with the passivation treatment solution. This allows a wider range of properties of the passivation treatment solution (e.g. higher or lower pH and/or higher concentration).

In an embodiment the passivation treatment solution is phosphoric acid and the second material (of the passivation layer 750) is chromium phosphate.

In alternative embodiments, the second material (of the passivation layer 750) may be any inorganic (at least carbon free) corrosion inhibitor, including one or more of: ZnO, phosphates, phosphonates, tungstates, silicates, molybdates, sodium chromates, nickel, cobalt, gallium, ruthene, orthophosphates or nitride or ruthenium, iridium, platinum, hafnium and their oxides/nitrides or oxynitrides.

The molecules of the passivation layer 750 do not penetrate into the first DUV absorbing layer 310, 320, 330 but stick to the surface by chemical and/or physical absorption.

Deposition of the passivation layer 750 may be performed for a second or further time after a period of use.

In an embodiment the structure of the sensor is as illustrated in FIGS. 4-6. As described above, the first DUV absorbing layer 310, 320, 330 may be comprised of three separate layers, these include a middle layer 320 of chromium (which may in fact contain up to 10% oxygen, for example 5-10% oxygen) and top and bottom layers 310, 330 of chromium oxide which may actually be a chromium oxynitride or a chromium oxycarbonitride. The sensor mark 17 is biased by −0.9V with respect to the grounded fluid handling structure 12 which may be made of stainless steel (thereby including a large percentage of chromium). In this embodiment corrosion of the first DUV absorbing layer 310, 320, 330 is reduced by changing its composition by doping, for example doping phosphor into one or more of the layers of the first DUV absorbing layer 310, 320, 330. This will result in an increase in the mobility of charge carriers. An increase in the mobility of charge carriers will increase the ability of the first DUV absorbing layer 310, 320, 330 to neutralise generated holes, thereby passivating the stack. Therefore in an embodiment the first DUV absorbing layer 310, 320, 330 of a sensor mark 17 comprises one or more layers of chromium, chromium oxide, chromium oxynitride or chromium oxycarbonitride doped with phosphor.

The concentration of dopant in one or more individual layers of the first DUV absorbing layer 310, 320, 330 is preferably in the range of 0.01-10% atomic concentration. The concentration may vary in a layer, for example there may be a concentration gradient. Each of the different layers 310, 320, 330 may have a different dopant concentration to the other layers 310, 320, 330.

In an embodiment, doping is achieved during the manufacture (i.e. first formation) of the first DUV absorbing layer 310, 320, 330. In an alternative embodiment as described below, the first formed DUV absorbing layer 310, 320, 330 if formed first and then treated such that it becomes doped.

In an embodiment one or more layers of the first DUV absorbing layer 310, 320, 330 may be deposited in the usual way. Before or after applying the layer 350 of TiN and/or upper layer 400 (both of which layers are optional) the layers of the first DUV absorbing layer 310, 320, 330 are doped by photo-electroplating.

In this embodiment the first DUV absorbing layer 310, 320, 330 is immersed in phosphoric acid with a pH of about 2. The first DUV absorbing layer 310, 320, 330 is illuminated with DUV with an integrated fluence up to 100 kJ/cm$^2$ and a cathodic potential of about −0.8V; alternatively the first DUV absorbing layer may be illuminated by VIS/NIR laser irradiation with an integrated fluence of up to 1 MJ/cm$^2$, both for DUV and VIS/NIR irradiation the presence of ultra pure water and/or solution containing phosphorus and/or cathodic potential on or near the stack 310, 320, 330 are optional. DUV irradiation may be delivered either on the stand alone tool, or in the litho-tool at the start of the use of the sensor. If a standalone tool is used the cathodic potential may be in the range 0-1 V. If no illumination is used, it may be necessary to immerse the first DUV absorbing layer 310, 320, 330 in the phosphoric acid with the above potential for an extended period of time, for example between 1 and 20 hours, optionally at an increased temperature of the immersion solution, for example in the range 20-100 C In an embodiment doping of one or more of the layers of the first DUV absorbing layer 310, 320, 330 may be accomplished by diffusion induced doping. For example, the first DUV absorbing layer 310, 320, 330 may be immersed in phosphoric acid and local heating of the first DUV absorbing layer 310, 320, 330 is achieved using laser illumination.

In the above mentioned embodiments, the phosphoric acid may be replaced by aqueous acidic chromium III phosphate solution.

In an alternative embodiment doping of the first DUV absorbing layer 310, 320, 330 may be achieved by ion implantation or co sputtering, that is adding a phosphorus-containing substance to the sputtering targets (of metallic Cr, or its oxide, nitride or oxinitride and their combination) or adding volatile Phosphorus substance to the gases (N2, O2, NO, NO2, CxHy, Ar) used at the production of the stacks 310, 320, 330 via sputtering deposition. Alternatives to doping with phosphor include doping with nitrogen atoms (nitrating) which can be achieved by the application of nitric acid, doping with halogens, for example doping with bromide. This will increase the number of free electrons in the first DUV absorbing layer 310, 320, 330 thereby increasing the recombination rate and neutralisation of holes. Molybdates, sodium chromates, other phosphates and silicates may be the dopants.

In an embodiment a passivation layer 750 may be applied and due to the processing (e.g. DUV, VIS or NIR irradiation), some doping of the first DUV layer 310, 320, 330 may occur. This is advantageous as it increases the bond strength between the passivation layer 750 and the first DUV absorbing layer 310, 320, 330.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

In a first aspect, there is provided a sensor mark comprising a substrate having a first deep ultra violet (DUV) absorbing layer comprising a first material which substantially absorbs DUV radiation, a first protecting layer comprising a second material; and wherein the first DUV absorbing layer has a first through hole in it, the first protecting layer is positioned, in the first protecting layer in the first through hole has a patterned region comprising a plurality of through holes; and the second material is more noble than the first material.

In a second aspect, the sensor mark of the first aspect further comprises a second protecting layer comprising a third material positioned on the first DUV absorbing layer.

In a third aspect the third material of the second aspect at least partially absorbs deep ultraviolet radiation and/or wherein the third material substantially reflects or transmits visible and/or infrared radiation.

In a fourth aspect the second material of the second or third aspect substantially absorbs deep ultra violet radiation.

In a fifth aspect the first deep ultra violet (DUV) absorbing layer and substrate of any of the first and fourth aspects are arranged substantially to suppress reflection of a range of wavelengths in the visible region at normal or grazing incidence.

In a sixth aspect the first protecting layer of any of the first to fifth aspects covers at least part the first DUV absorbing layer thereby to prevent exposure of the first DUV absorbing layer.

In a seventh aspect the second protecting layer of any of the first to sixth aspects covers an edge of the first deep ultra violet (DUV) absorbing layer which defines the first through hole.

In an eighth aspect the first deep ultra violet (DUV) absorbing layer of any of the first to seventh aspects comprises at least two sub-layers in different materials.

In a ninth aspect the first protecting layer of any of the first to eighth aspects covers more than half of the area of the first through hole in the first deep ultra violet (DUV) absorbing layer.

In a tenth aspect an edge of the first DUV absorbing layer of any of the first to ninth aspects defines the first through hole and the first protecting layer covers the edge.

In a eleventh aspect the first protecting layer of any of the first to tenth aspects is at least formed partly on the first DUV absorbing layer.

In a twelfth aspect the second protecting layer of any of the first to eleventh aspects is formed partly on the first protecting layer.

In a thirteenth aspect the first protecting layer of any of the first to twelfth aspects is formed partly on the second protecting layer.

In a fourteenth aspect the second material of any of the first to thirteenth aspects is a noble metal, preferably Ruthenium, Rhodium, Palladium, Silver, Iridium, Platinum or Gold.

In a fifteenth aspect the second material of any of the first to thirteenth aspects is more noble than nickel.

In a sixteenth aspect the second material of any of the first to thirteenth aspects comprises a ceramic or oxide, preferably oxide or nitride of a metal or mix of metals more noble than nickel.

In a seventeenth aspect the second material of any of the first to thirteenth aspects comprises a metalloid, preferably metal nitride or a mix of metal nitrides, preferably CrN, MoN, TiN, Si3N4, Ge3N4, AlTiN or TiAlN, HfN, TaN.

In a eighteenth aspect the second material of any of the first to thirteenth aspects comprises a silicide of a metal more noble than nickel, preferably MoSi, TaSi or RuSi.

In a nineteenth aspect, the sensor mark of the first to eighteenth aspects, further comprises a first DUV absorbing layer, wherein the first protecting layer is at least partially encapsulated by the first protecting layer or the second protecting layer.

In a twentieth aspect the third material of any of the first to ninetieth aspects comprises TiN.

In a twenty first aspect, there is provided a sensor mark comprising a substrate and at least one layer wherein a patterned region of the at least one layer is surrounded by a surrounding region, and the patterned region is for imparting a characteristic to a beam of radiation, and the at least one layer further comprises a current limiter adapted to limit the flow of electrons in the at least one layer from the patterned region to the surrounding region and vice versa.

In a twenty second aspect the current limiter of the twenty first aspect comprises an electrically insulating region in the at least one layer between the patterned region and the surrounding region.

In a twenty third aspect the electrically insulating region of the twenty first or twenty second aspect is a through hole in a first layer of the at least one layer.

In a twenty fourth aspect the sensor mark of any of the twenty first to twenty third aspects further comprises a second layer.

In a twenty fifth aspect the through hole of the twenty fourth aspect is absent in the second layer and the first layer is made of an electrically conducting material.

In a twenty sixth aspect the electrically insulating region of any of the twenty first to twenty fifth aspects substantially surrounds the patterned region.

In a twenty seventh aspect an electrically conducting bridge is provided between the patterned region and the surrounding region of any of the twenty first to twenty sixth aspects for allowing an electrical bias to be applied to the patterned region via the surrounding region.

In a twenty eighth aspect, there is provided a sensor mark comprising a substrate, at least one electrically conducting layer and an electrically insulating layer on the at least one electrically conducting layer; at least one through hole in the electrically insulating layer exposing at least one exposed region of the at least one electrically conductive layer; the at least one exposed region comprising at least one patterned region for imparting a characteristic to a beam of radiation, wherein an area in plan of the at least one patterned region is at least 10 times smaller than an area in plan of the at least one exposed region.

In a twenty ninth aspect the at least one electrically conducting layer of the twenty eighth aspect comprises at least two layers, an upper of the at least two electrically conducting layers having a through hole therein in the exposed region and the patterned region being formed in a lower of the at least two electrically conducting layers in the through hole in the upper of the at least two electrically conducting layers.

In a thirtieth aspect at least one of the at least one exposed regions of the twenty eighth or twenty ninth aspects does not comprise a patterned region.

In a thirty first aspect in the at least one of the at least one exposed regions of the twenty ninth aspect which does not comprise a patterned region, the lower of the at least two electrically conducting layers is covered by the upper of the at least two electrically conductive layers.

In a thirty second aspect, there is provided a sensor mark comprising a substrate, at least one electrically conducting layer and an electrically insulating layer on the at least one electrically conducting layer at least one through hole in the electrically insulating layer exposing at least one exposed region of the at least one electrically conducting layer; the at least one exposed region comprising at least one patterned region for imparting a characteristic to a beam of radiation, wherein the at least one patterned region is displaced from the geometric centre of its corresponding exposed region.

In a thirty third aspect a maximum dimension of the patterned region of the thirty second aspect is smaller than a distance between the geometric centre of the corresponding exposed region and the geometric centre of the patterned region.

In a thirty fourth aspect, there is provided a sensor mark comprising a substrate a DUV absorbing layer which substantially absorbs DUV radiation and comprises a patterned region comprising a plurality of through holes for imparting a characteristic to a beam of radiation, a DUV transmissive layer which substantially transmits DUV covering a surface of the DUV absorbing layer opposite to the substrate, and edge portions preventing exposure of the DUV absorbing layer at the outer edges of the through holes wherein the edge portions are in the same plane as the DUV absorbing layer and the DUV transmissive layer covers a portion of each of the edge portions. In a thirty fifth aspect, there is provided a method manufacturing a sensor mark, the method comprising providing a substrate with a DUV absorbing layer on a first layer on a substrate and a second layer on top of the DUV absorbing layer; first forming a pattern of through holes through the first layer, the DUV absorbing layer and the second layer; and second forming edge portions preventing exposure of edges of the DUV absorbing layer at the outer edges of the through holes.

In a thirty fifth aspect, there is provided a method manufacturing a sensor mark, the method comprising providing a substrate with a DUV absorbing layer on a first layer on a substrate and a second layer on top of the DUV absorbing layer first forming a pattern of through holes through the first layer, the DUV absorbing layer and the second layer; and second forming edge portions preventing exposure of edges of the DUV absorbing layer at the outer edges of the through holes.

In a thirty sixth aspect, the second forming of the thirty fifth aspect comprises oxidation of material of the DUV absorbing layer exposed by the first forming.

In a thirty seventh aspect the second forming of the thirty fifth aspect comprises nitridization of material of the DUV absorbing layer exposed by the first forming.

In a thirty eighth aspect, there is provided a lithographic projection apparatus, comprising a support table configured to support an object; a projection system configured to project a patterned radiation beam onto the object; a fluid handling structure configured to confine an immersion liquid to a space between the projection system and the support table and/or the object; an electrical power supply configured to supply a bias voltage between the object and the fluid handling structure, the electrical power supply forming an electrical circuit comprising the electrical power supply, the fluid handling structure, the object and the immersion liquid in the space; and a current limiter adapted to suppress current flowing in the electrical circuit when the object passes under a facing surface of the fluid handling structure.

In a thirty ninth aspect the current limiter of the thirty eighth aspect comprises a resistor in the electrical circuit adapted to increase in resistance and thereby suppress the current flowing in the electrical circuit when the object passes under the facing surface of the fluid handling structure.

In a fortieth aspect the resistor of the thirty ninth aspect comprises a ballast resistor.

In a forty first aspect the resistor of the thirty ninth aspect comprises a thyristor.

In a forty second aspect the current limiter of the thirty eighth aspect comprises a coating on a portion of the facing surface of the fluid handling structure under which the object is adapted to pass.

In a forty third aspect the coating of the forty second aspect comprises at least one layer which is electrically insulting.

In a forty fourth aspect the bulk resistance of the electrically insulating layer of the forty second or forty third aspect is $10^{10}$ Ohm*m or greater.

In a forty fifth aspect the material of the coating of the forty second, forty third or forty fourth aspect comprises $B_2O_3$, $Al_2O_3$, $SiO_2$, $Ga_2O_3$.

In a forty sixth aspect, there is provided a sensor mark comprising a substrate having a first deep ultra violet (DUV) absorbing layer on the substrate comprising a first material which substantially absorbs DUV radiation and comprising a plurality of through-holes for imparting a characteristic to a beam of radiation; and a passivation layer comprising a second material covering the first DUV absorbing layer thereby to prevent exposure of edges of the first DUV absorbing layer at the outer edges of the through-holes and/or a top surface of the first DUV absorbing layer, wherein the second material is more noble than the first material.

In a forty seventh aspect the passivation layer of the forty sixth aspect is an anodic inhibitor.

In a forty eighth aspect the second material of the forty sixth or forty seventh aspect is chromium phosphate.

In a forty ninth aspect the second material of the forty sixth, forty seventh or forty eighth aspect comprises one or more materials selected from the group consisting: ZnO, phosphates, phosphonates, tungstates, silicates, molybdates, sodium chromates, nickel, cobalt, gallium, ruthene, orthophosphate or nitride or ruthenium, iridium, platinum, hafnium and their oxides/nitrides or oxynitrides.

In a fiftieth aspect, there is provided a method manufacturing a sensor mark, the method comprising providing a substrate with a DUV absorbing layer comprising a first material; first forming a pattern of through-holes through the DUV absorbing layer; and immersing at least a portion of the DUV absorbing layer including the pattern of through-holes in a passivation treatment solution thereby forming a passivation layer comprising a second material covering the first DUV absorbing layer thereby to prevent exposure of edges of the first DUV absorbing layer at the outer edges of the through-holes and/or a top surface of the DUV absorbing layer, wherein: the second material is more noble than the first material.

In a fifty first aspect, the fiftieth aspect further includes applying an electrical bias to the portion of the DUV absorbing layer whilst it is immersed in the passivation treatment solution.

In a fifty second aspect the passivation treatment solution of the fiftieth or fifty first aspect includes phosphoric acid.

The invention claimed is:

1. A sensor mark comprising:
a substrate having:
a deep ultra violet (DUV) radiation absorbing layer comprising a first material which substantially absorbs DUV radiation; and
a first protecting layer comprising a second material, wherein:
the DUV radiation absorbing layer has a through hole in it;
the first protecting layer is positioned, in plan, in the through hole and the first protecting layer in the through hole has a patterned region comprising a plurality of through holes; and
the second material is more noble than the first material.

2. The sensor mark of claim 1, further comprising a second protecting layer comprising a third material positioned on the DUV radiation absorbing layer.

3. The sensor mark of claim 2, wherein the third material at least partially absorbs deep ultraviolet radiation and/or wherein the third material substantially reflects or transmits visible and/or infrared radiation.

4. The sensor mark of claim 2, wherein the second material substantially absorbs deep ultra violet radiation.

5. The sensor mark of claim 2, wherein the second protecting layer covers an edge of the DUV radiation absorbing layer which defines the through hole.

6. The sensor mark of claim 2, wherein the second protecting layer is formed partly on the first protecting layer.

7. The sensor mark of claim 1, wherein the DUV radiation absorbing layer and substrate are arranged to substantially suppress reflection of a range of wavelengths in the visible region at normal or grazing incidence.

8. The sensor mark of claim 1, wherein the first protecting layer covers at least part of the DUV radiation absorbing layer to prevent exposure of the DUV radiation absorbing layer.

9. The sensor mark of claim 1, wherein the DUV radiation absorbing layer comprises at least two sub-layers in different materials.

10. The sensor mark of claim 1, wherein the first protecting layer covers more than half of the area of the through hole in the DUV radiation absorbing layer.

11. The sensor mark of claim 1, wherein an edge of the DUV radiation absorbing layer defines the through hole and the first protecting layer covers the edge.

12. The sensor mark of claim 1, wherein the first protecting layer is at least formed partly on the DUV radiation absorbing layer.

13. The sensor mark of claim 1, wherein the first protecting layer is formed partly on a second protecting layer comprising a third material positioned on the DUV radiation absorbing layer.

14. The sensor mark of claim 1, wherein the second material is a noble metal.

15. The sensor mark of claim 1, wherein the second material comprises a ceramic or oxide, or a metalloid, or a silicide.

16. A sensor mark comprising:
a substrate having:
a deep ultra violet (DUV) radiation absorbing layer on the substrate comprising a first material which substantially absorbs DUV radiation, the DUV radiation absorbing layer comprising a plurality of through-holes for imparting a characteristic to a beam of radiation; and
a passivation layer comprising a second material, the passivation layer covering the DUV radiation absorbing layer to prevent exposure of edges of the DUV radiation absorbing layer at outer edges of the through-holes and/or a top surface of the DUV radiation absorbing layer,
wherein the second material is more noble than the first material.

17. The sensor mark of claim 16, wherein the passivation layer is an anodic inhibitor.

18. The sensor mark of claim 16, wherein the second material is chromium phosphate.

19. The sensor mark of claim 16, wherein the second material comprises one or more selected from: ZnO, a phosphate, a phosphonate, a tungstate, a silicate, a molybdate, a sodium chromate, nickel, cobalt, gallium, ruthene, orthophosphate or nitride or ruthenium, iridium, platinum, hafnium and any of their oxides/nitrides or oxynitrides.

20. A sensor mark comprising:
a substrate having:
- a deep ultra violet (DUV) radiation absorbing layer comprising a material which substantially absorbs DUV radiation, wherein the DUV radiation absorbing layer has a patterned region comprising a plurality of through holes for imparting a characteristic to a beam of radiation;
- a DUV radiation transmissive layer which substantially transmits DUV radiation, the DUV radiation transmissive layer covering a surface of the DUV radiation absorbing layer opposite to the substrate; and
- edge portions preventing exposure of the DUV radiation absorbing layer at outer edges of the through holes, wherein:
- the edge portions are in the same plane as the DUV radiation absorbing layer; and
- the DUV radiation transmissive layer covers a portion of each of the edge portions.

* * * * *